(12) United States Patent
More

(10) Patent No.: US 12,550,363 B2
(45) Date of Patent: Feb. 10, 2026

(54) EPITAXIAL SOURCE/DRAIN CONFIGURATIONS FOR MULTIGATE DEVICES

(71) Applicant: Taiwan Semiconductor Manufacturing Company, Ltd., Hsin-Chu (TW)

(72) Inventor: Shahaji B More, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 974 days.

(21) Appl. No.: 17/692,361

(22) Filed: Mar. 11, 2022

(65) Prior Publication Data

US 2023/0119286 A1   Apr. 20, 2023

Related U.S. Application Data

(60) Provisional application No. 63/255,497, filed on Oct. 14, 2021.

(51) Int. Cl.
*H10D 89/10* (2025.01)
*H10D 30/01* (2025.01)
*H10D 30/62* (2025.01)
*H10D 62/10* (2025.01)

(Continued)

(52) U.S. Cl.
CPC ....... *H10D 30/6219* (2025.01); *H10D 30/024* (2025.01); *H10D 30/6211* (2025.01); *H10D 62/115* (2025.01); *H10D 84/0128* (2025.01); *H10D 84/013* (2025.01);

(Continued)

(58) Field of Classification Search
None
See application file for complete search history.

(56) References Cited

U.S. PATENT DOCUMENTS

| 2016/0268414 A1 | 9/2016 | Park et al. |
| 2018/0158930 A1 | 6/2018 | Liao et al. |

(Continued)

FOREIGN PATENT DOCUMENTS

TW   201905985 A   2/2019

*Primary Examiner* — Steven B Gauthier
*Assistant Examiner* — Lamont B Koo
(74) *Attorney, Agent, or Firm* — HAYNES AND BOONE, LLP

(57) ABSTRACT

A semiconductor structure includes a first multigate device, a second multigate device, and an isolation structure. The first multigate device has a first channel layer extending between first epitaxial source/drains along a first direction. The second multigate device has a second channel layer extending between second epitaxial source/drains along the first direction. The first epitaxial source/drains and second epitaxial source/drains have a first width and a second width, respectively, along a second direction that is different than the first direction. The isolation structure includes a dielectric fin over a substrate isolation feature. The dielectric fin is between the first epitaxial source/drains and the second epitaxial source/drains. The dielectric fin has a third width along the second direction. A distance between the first epitaxial source/drains and the second epitaxial source/drains along the second direction is greater than the third width, less than the second width, and less than the first width.

20 Claims, 6 Drawing Sheets

(51) Int. Cl.
    *H10D 84/01*     (2025.01)
    *H10D 84/03*     (2025.01)

(52) U.S. Cl.
    CPC ..... *H10D 84/0151* (2025.01); *H10D 84/0158* (2025.01); *H10D 84/038* (2025.01)

(56) References Cited

U.S. PATENT DOCUMENTS

2019/0244865 A1     8/2019   Xu et al.
2020/0043935 A1*   2/2020   Liaw ................. H10D 30/0243

* cited by examiner

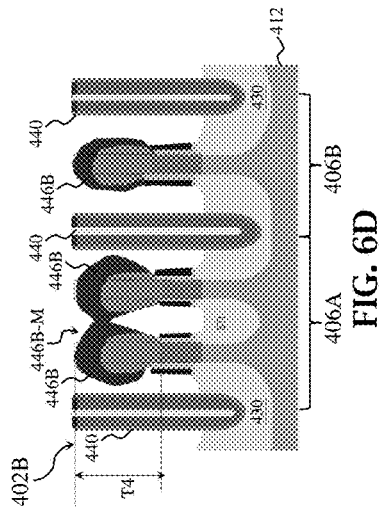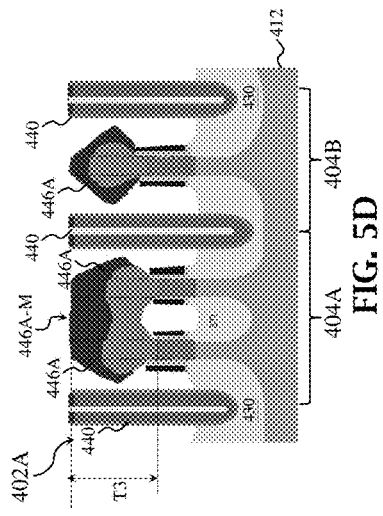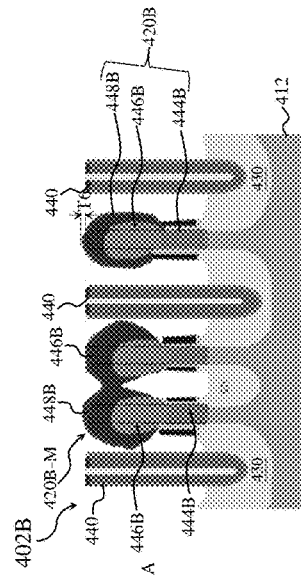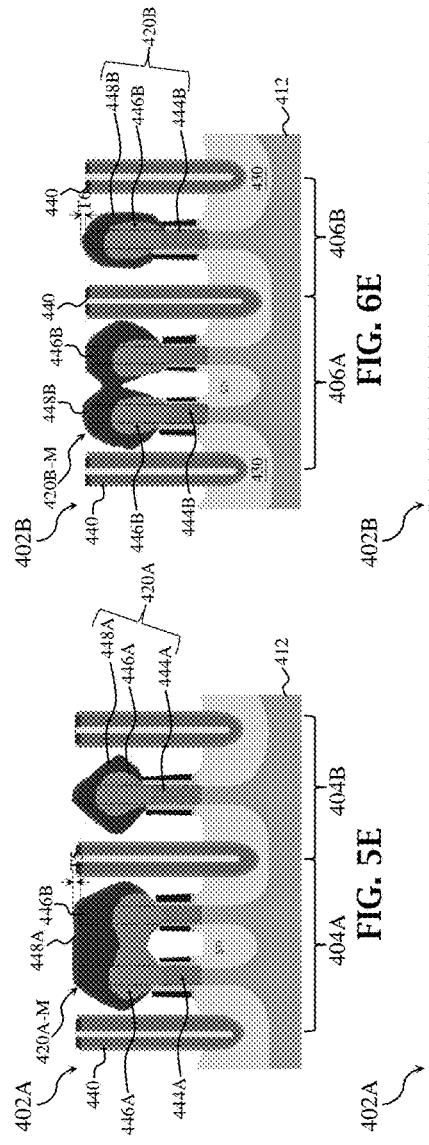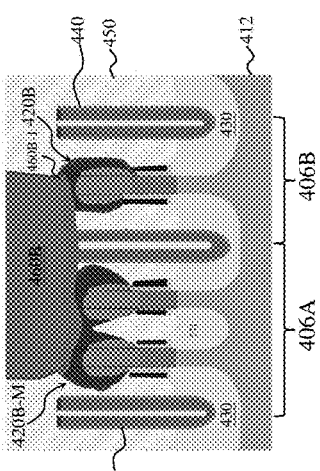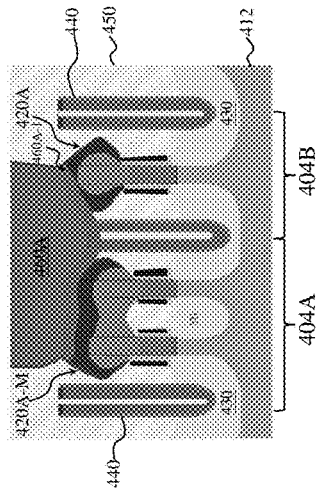

EPITAXIAL SOURCE/DRAIN CONFIGURATIONS FOR MULTIGATE DEVICES

This application is a non-provisional application of and claims benefit of U.S. Provisional Patent Application Ser. No. 63/255,497, filed Oct. 14, 2021, the entire disclosure of which is incorporated herein by reference.

BACKGROUND

Multigate devices include a gate structure that extends, partially or fully, around a channel region to provide access to the channel region on at least two sides. Exemplary multigate devices include fin-like field effect transistors (FinFETs) and gate-all around (GAA) transistors, such as nanowire transistors. Multigate devices enable aggressive scaling down of IC technologies, maintaining gate control and mitigating short-channel effects (SCEs), while seamlessly integrating with conventional IC manufacturing processes. However, as multigate devices continue to scale, epitaxial source/drain configurations are needed for facilitating smaller IC feature sizes and denser packing of IC features needed for advanced IC technology nodes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5A-5F are fragmentary cross-sectional views of a multigate device, in portion or entirety, at various fabrication stages according to various aspects of the present disclosure.

FIGS. 6A-6F are fragmentary cross-sectional views of a multigate device, in portion or entirety, at various fabrication stages according to various aspects of the present disclosure.

DETAILED DESCRIPTION

Figure 1:
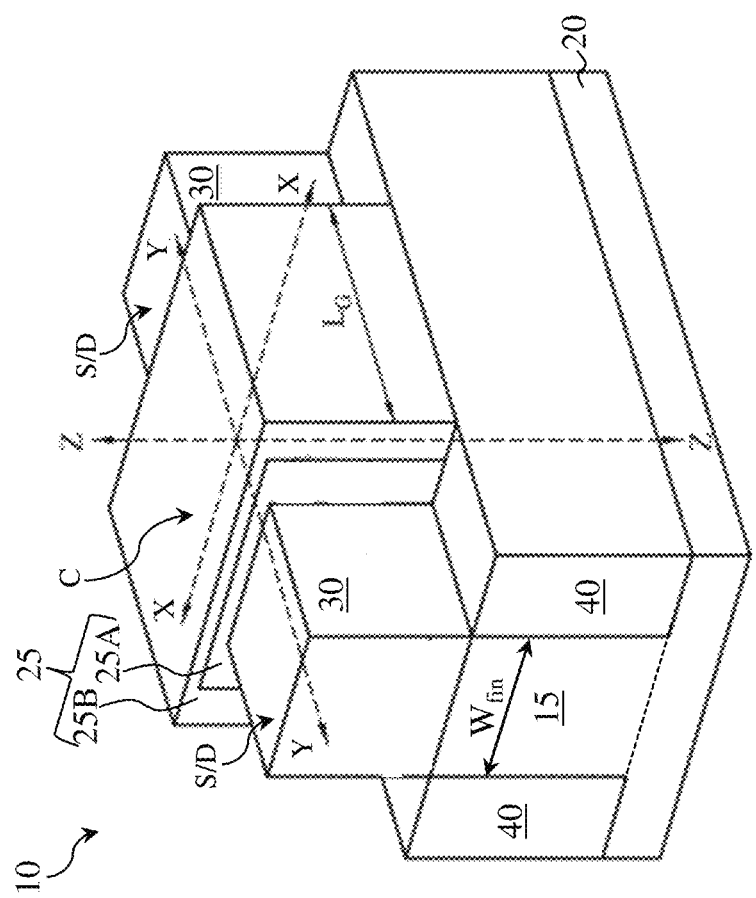
FIG. 1 is fragmentary perspective view of a multigate device, in portion or entirety, according to various aspects of the present disclosure.

The present disclosure relates generally to configurations of epitaxial source/drains that can enhance performance and/or facilitate dense packing of multigate devices, such as fin-like field-effect transistors (FETs) and/or gate-all-around (GAA) FETs.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

For advanced IC technology nodes, non-planar transistors, such as FinFETs and GAA transistors (collectively referred to as multigate devices), have become a popular and promising candidate for high performance and low leakage applications. FIG. 1 is a fragmentary perspective view of an exemplary multigate device 10, in portion or entirety, according to various aspects of the present disclosure. Multigate device 10 is a FinFET that includes a fin 15 extending from a substrate 20. Fin 15 has a length along a y-direction, a width along an x-direction ($W_{fin}$), and a height along a z-direction. In FIG. 1, fin 15 has a non-recessed portion disposed between recessed portions, and the FinFET further includes a gate stack 25 that wraps and engages the non-recessed portion of fin 15 (e.g., gate stack 25 is disposed on a top and opposing sidewalls of the non-recessed portion of fin 15) and epitaxial source/drains 30 disposed over the recessed portions of fin 15 (e.g., epitaxial source/drains 30 are disposed on tops of the recessed portions of fin 15). The FinFET has a channel region (C) disposed between source/drain regions (S/D), where the channel region is provided by the non-recessed portion of fin 15 and the source/drain regions are provided by epitaxial source/drains 30 and underlying recessed portions of fin 15. During operation of the FinFET, current can flow through the channel region (e.g., non-recessed portion of fin 15) and between the source/drain regions (e.g., epitaxial source/drain structures 30). Gate stack 25 has a gate length (LG) along the y-direction, and in the depicted embodiment, gate stack 25 includes a gate dielectric 25A and a gate electrode 25B. In some embodiments, gate spacers are disposed along sidewalls of gate stack 25, and the gate spacers wrap the non-recessed portion of fin 15. A substrate isolation feature 40, such as a shallow trench isolation (STI) structure, electrically isolates the FinFET from other devices and/or regions of multigate device 10. Substate isolation feature 40 is disposed over substrate 20, along sidewalls of the recessed portions of fin 15, and along sidewalls of lower portions of the non-recessed portion of fin 15. Gate stack 25 extends over the top of substrate isolation feature 40. In some embodiments, substrate isolation feature 40 surrounds a lower portion of fin 15. In some embodiments, fin 15 is not recessed in the source/drain regions of the FinFET, and epitaxial source/drains 30 wrap fin 15 (e.g., epitaxial source/drains 30 are disposed on tops and opposing sidewalls of fin 15). In some embodiments, dielectric sidewall spacers, such as fin sidewall spacers disposed over substrate isolation feature 40 and along a portion of sidewalls of fin 15 and gate spacers disposed over substrate isolation feature 40 and along sidewalls of gate stack 25, are formed before epitaxial source/drains 30. In some embodiments, multigate device 10 is a portion of an IC chip, a system on chip (SoC), or portion thereof, that includes various passive and active microelectronic devices, such as resistors, capacitors, inductors, diodes, p-type FETs (PFETs), n-type FETs (NFETs), metal-oxide semiconductor FETs (MOSFETs), complementary metal-oxide semiconductor (CMOS) transistors, bipolar junction transistors (BJTs), laterally diffused MOS (LD-MOS) transistors, high voltage transistors, high frequency transistors, other suitable components, or combinations thereof. FIG. 1 has been simplified for the sake of clarity to better understand the inventive concepts of the present disclosure. Additional features can be added in multigate device 10, and some of the features described below can be replaced, modified, or eliminated in other embodiments of multigate device 10.

Metal contacts are typically formed to provide electrical connection to and facilitate operation of the FinFET, such as a gate contact to gate stack 25 and source/drain contacts to epitaxial source/drains 30. As IC feature sizes continue to shrink with advanced IC technology nodes, lateral dimensions of epitaxial source/drains 30 are correspondingly decreasing, which has led to decreasing source/drain contact landing windows/areas and increasing sensitivity of the FinFET to source/drain contact overlay/alignment issues during fabrication. To enlarge the source/drain contact landing window, it is desirable to increase the lateral dimensions of epitaxial source/drains 30, for example, by configuring epitaxial growth process parameters to increase lateral growth of epitaxial source/drain material and cause epitaxial source/drains 30 to laterally extend along the x-direction beyond sidewalls of fin 15. However, increasing the lateral dimensions of epitaxial source/drains 30 reduces spacing between epitaxial source/drains 30 and epitaxial source/drains of adjacent FinFETs, which can lead to unintentional merging of epitaxial source/drains 30 with epitaxial source/drains of adjacent FinFETs, particularly as fin pitches and/or gate pitches are reduced to increase device density. As one example, dopants extruding from epitaxial source/drains during annealing processes implemented to activate dopants in the epitaxial source/drains after deposition have been observed to cause merging of epitaxial source/drains of adjacent FinFETs. As another example, dopants extruding from epitaxial source/drains during an annealing process implemented for source/drain contact formation, such as that used to form silicide features over the epitaxial source/drains, have been observed to cause merging of epitaxial source/drains of adjacent FinFETs. Unintentional merging of epitaxial source/drains of adjacent FinFETs can cause electrical shorting, which degrades performance and/or reliability of multigate devices. Further, because lithography resolution (i.e., a minimum feature size that can be printed onto a resist layer) is limited, a size of a resist opening for exposing an n-type FinFET region may be larger than intended and unintentionally expose a p-type FinFET region when fabricating FinFETs with tighter fin pitches and/or fin spacings, which can lead to n-type epitaxial source/drain residue forming in the p-type FinFET region when depositing n-type epitaxial source/drain material in source/drain regions of the n-type FinFET region. This n-type epitaxial source/drain residue (which is sometimes referred to as device remain defects) can prevent and/or reduce deposition of p-type epitaxial source/drain material in source/drain regions of the p-type FinFET region and also negatively impact and/or undesirably alter performance of FinFETs in the p-type FinFET region. Device remain defects, such as p-type epitaxial source/drain residue, can also occur in the n-type FinFET region.

The present disclosure addresses these challenges and provides FinFETs having epitaxial source/drains with optimized lateral dimensions and/or lateral spacings for advanced technology nodes, such as those having fin pitches of about 20 nm to about 35 nm and/or gate pitches of about 35 nm to about 60 nm to maximize FinFET density and/or device density. For example, increasing lateral dimensions (e.g., widths) of epitaxial source/drains increases source/drain contact landing windows and/or relaxes source/drain contact alignment/overlay requirements when forming source/drain contacts. Epitaxial source/drains described herein thus have lateral dimensions and lateral spacings that maximize source/drain contact landing windows while minimizing and/or preventing unintentional merging between epitaxial source/drains of adjacent FinFETs. As another example, epitaxial source/drains described herein have lateral dimensions and lateral spacings that minimize epi material residue (i.e., device remain defects) in n-type FinFET regions and p-type FinFET regions that can result from limited lithography resolution. The lateral dimensions and/or lateral spacings disclosed herein also account for epitaxial source/drain profile variations of different type multigate devices and additional isolation and/or additional merging prevention provided by isolation fins disposed between epitaxial source/drains. For example, lateral spacings are configured greater than widths of isolation fins to reduce and/or prevent epi material residue from forming and/or remaining on isolation fins during fabrication of epitaxial source/drains. Different embodiments may have different advantages, and no particular advantage is necessarily required of any embodiment.

Figure 2:
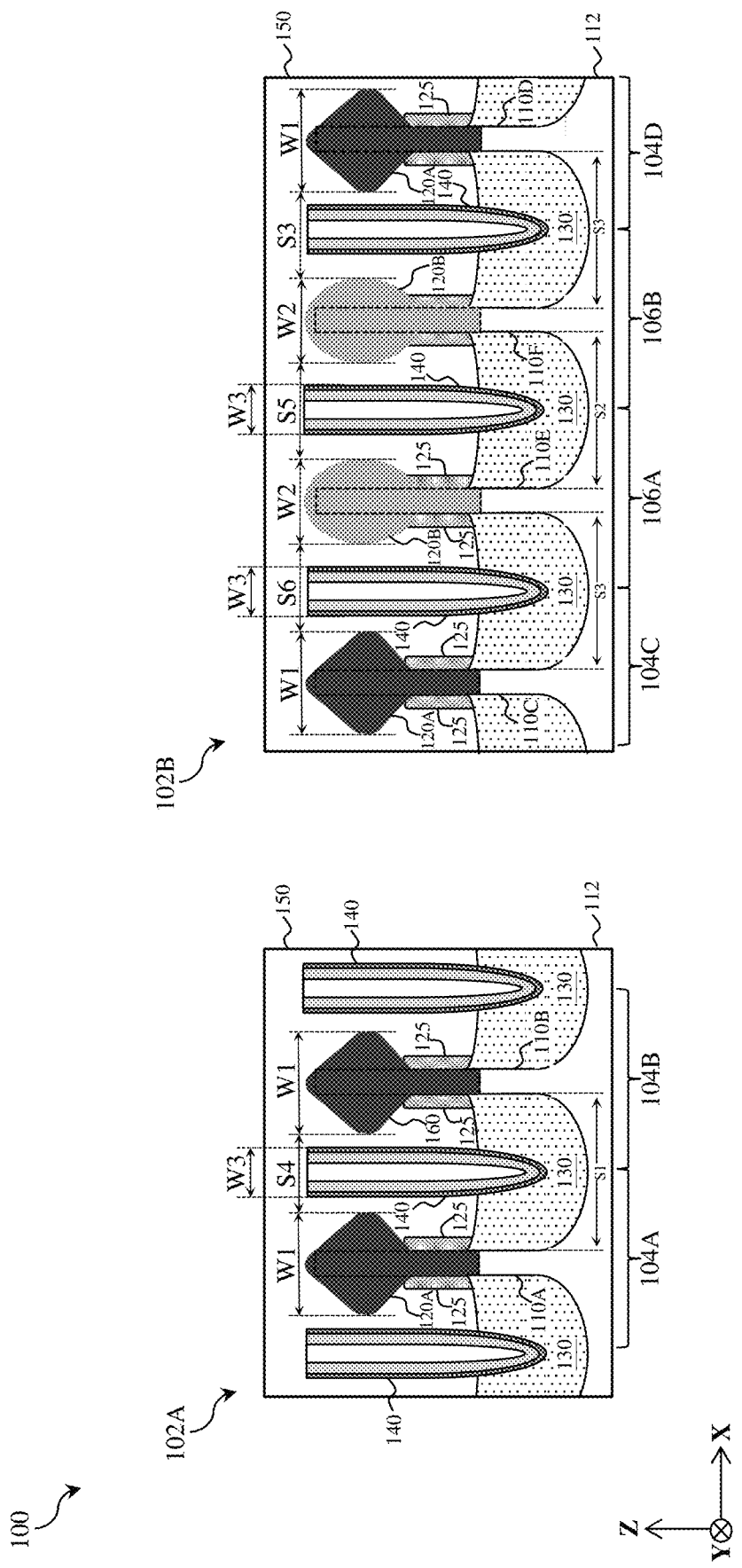
FIG. 2 is a fragmentary cross-sectional view of a multigate device, in portion or entirety, according to various aspects of the present disclosure.
Figure 3:
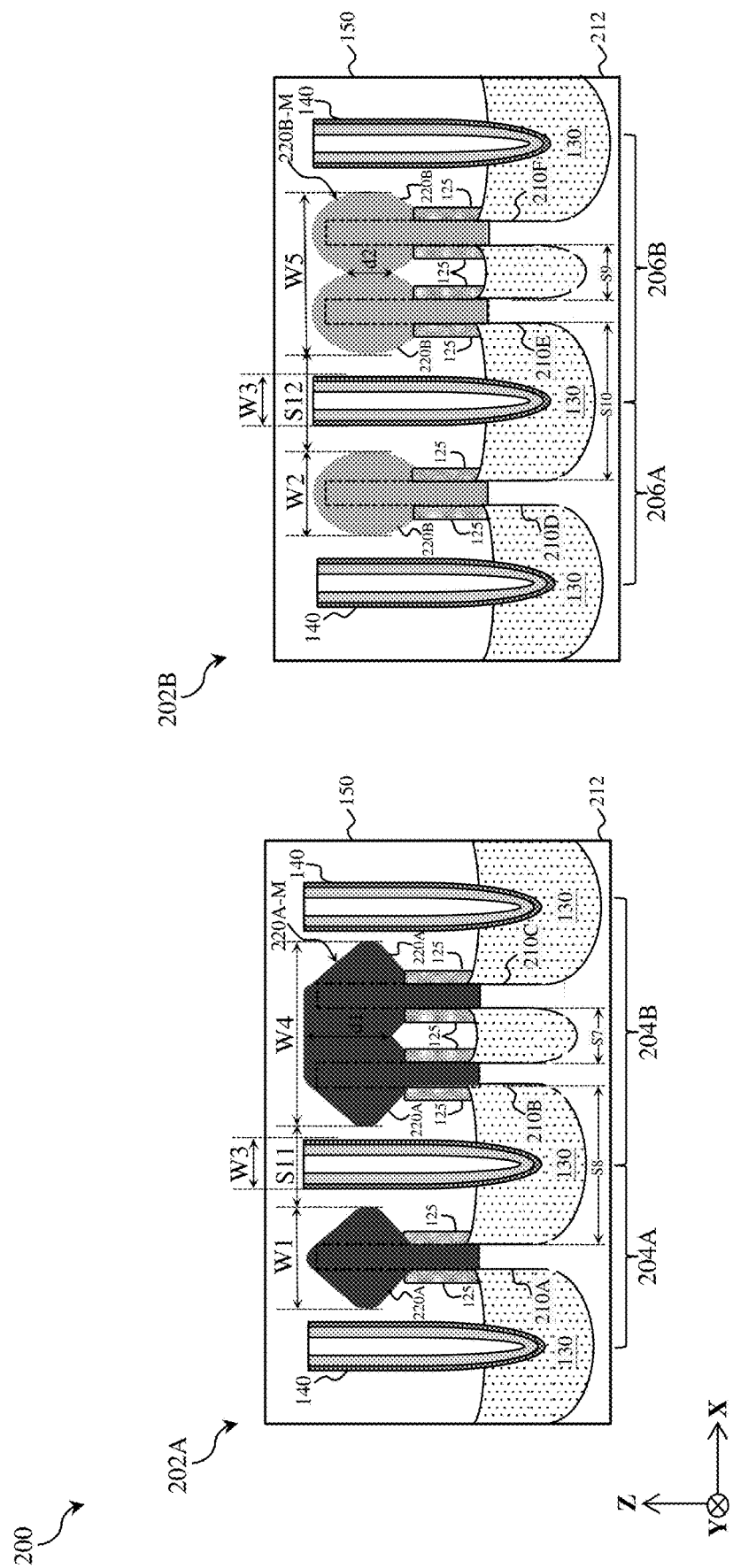
FIG. 3 is a fragmentary cross-sectional view of a multigate device, in portion or entirety, according to various aspects of the present disclosure.
Figure 4:
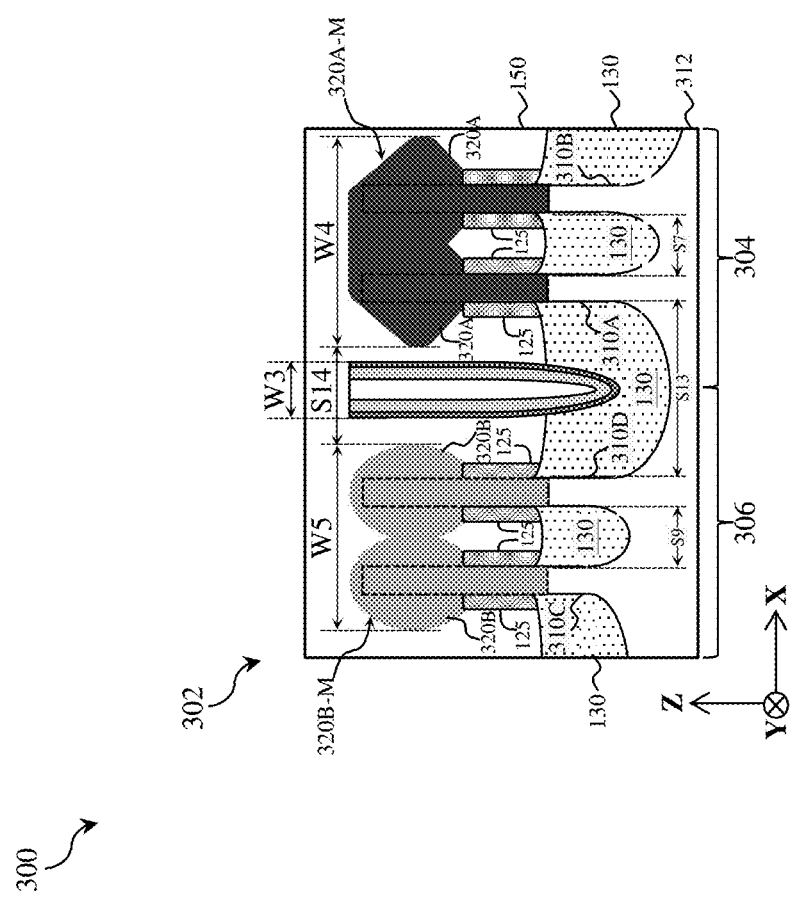
FIG. 4 is a fragmentary cross-sectional view of a multigate device, in portion or entirety, according to various aspects of the present disclosure.

FIGS. 2-4 are fragmentary cross-sectional views of multigate devices having optimized epitaxial source/drain dimensions, in portion or entirety, according to various aspects of the present disclosure. For example, FIG. 2 depicts a multigate device 100, FIG. 3 depicts a multigate device 200, and FIG. 4 depicts a multigate device 300. Multigate device 100, multigate device 200, and multigate device 300 each include at least one FinFET, which generally refers to a transistor having a channel formed from at least one semiconductor fin extending from a substrate, where the channel is disposed between a source and a drain and a gate of the transistor wraps the at least one semiconductor fin (for example, the gate is disposed on three sides of the channel, as opposed to one side of the channel as in a planar transistor). The cross-sectional views of FIGS. 2-4 are obtained by "cutting" the FinFETs of multigate device 100, multigate device 200, and multigate device 300 along the x-direction shown in FIG. 1, and thus, the cross-sectional views in FIGS. 2-4 may be referred to as x-cut views. Further, the x-cut views are taken through source/drain regions of the FinFETs (i.e., portions of the FinFETs that include, for example, epitaxial source/drains and are located outside gates/channel regions of the FinFETs and thus are not wrapped by the gates). Hence, gates of the FinFETs of multigate device 100, multigate device 200, and multigate device 300 are not directly visible in FIGS. 2-4. Multigate device 100, multigate device 200, and multigate device 300, or combinations thereof may be included in a microprocessor, a memory, other IC device, or combinations thereof. In some embodiments, multigate device 100, multigate device 200, multigate device 300, or combinations thereof are a portion of an IC chip, an SoC, or portion thereof, that includes various passive and active microelectronic devices, such as resistors, capacitors, inductors, diodes, PFETs, NFETs, MOSFETs, CMOS transistors, BJTs, LDMOS transistors, high voltage transistors, high frequency transistors, other suitable components, or combinations thereof. FIGS. 2-4 have been simplified for the sake of clarity to better understand the inventive concepts of the present disclosure. Additional features can be added in multigate device 100, multigate device 200, multigate device 300, or combinations thereof and some of the features described below can be replaced, modified, or eliminated in other embodiments of multigate device 100 multigate device 200, multigate device 300, or combinations thereof.

Referring to FIG. 2, multigate device 100 includes a device region 102A and a device region 102B. Device region 102A includes a p-type FinFET 104A and a p-type FinFET 104B, and device region 102B includes a p-type FinFET 104C, a p-type FinFET 104D, an n-type FinFET 106A, and an n-type FinFET 106B. P-type FinFETs 104A-104D, n-type FinFET 106A, and n-type FinFET 106B are each single-fin FinFETs (i.e., each FinFET includes a single fin, where a channel of the FinFET is formed in a single fin). For example, p-type FinFETs 104A-104D have a fin 110A, a fin 110B, a fin 110C, a fin 110D, respectively, extending from a substrate 112, and n-type FinFET 106A and n-type FinFET 106B each have a fin 110E and a fin 110F, respectively, extending from substrate 112. Fins 110A-110F are oriented substantially parallel to each other, extend lengthwise along a y-direction (i.e., length is along the y-direction, width is along the x-direction, and height is along the z-direction), and are spaced from each other along the x-direction. In FIG. 2, a spacing S1 is between fins of p-type FinFETs (e.g., fin 110A and fin 110B are separated by spacing S1), a spacing S2 is between fins of n-type FinFETs (e.g., fin 110E and fin 110F are separated by spacing S2), and a spacing S3 is between fins of different type FinFETs (e.g., fin 110C and fin 110E are separated by spacing S3 and fin 110F and fin 110D are separated by spacing S3). In some embodiments, spacing S1 is about 40 nm to about 60 nm. In some embodiments, spacing S2 is about 40 nm to about 60 nm. In some embodiments, spacing S3 is about 35 nm to about 55 nm. In some embodiments, spacing S1, spacing S2, and spacing S3 are the same. In some embodiments, spacing S1 and spacing S2 are different. In some embodiments, spacing S1 and spacing S3 are different. In some embodiments, spacing S2 and spacing S3 are different.

Fins 110A-110F and/or substrate 112 include an elementary semiconductor, such as silicon and/or germanium; a compound semiconductor, such as silicon carbide, gallium arsenide, gallium phosphide, indium phosphide, indium arsenide, indium antimonide, or combinations thereof; an alloy semiconductor, such as SiGe, GaAsP, AlInAs, AlGaAs, GaInAs, GaInP, GaInAsP, or combinations thereof; or combinations thereof. In some embodiments, substrate 112 is a silicon substrate, and fins 110A-110F include silicon, germanium, silicon germanium, other suitable semiconductor material, or combinations thereof. In some embodiments, fins 110A-110F are a portion of substrate 112, such as a portion of a material layer of substrate 112. For example, where substrate 112 includes silicon, fins 110A-110F are silicon fins. In some embodiments, fins 110A-110F are semiconductor layers disposed on substrate 112. In some embodiments, fins 110A-110F include the same material (e.g., fins 110A-110F are silicon fins). In some embodiments, fins 110A-110F include different materials. In some embodiments, compositions of fins 110A-110F are configured based on a type of FinFET to which fins 110A-110F belong. For example, fins 110A-110D, which form a portion of p-type FinFETs 104A-104D, are silicon germanium fins, while fin 110E and fin 110F, which form a portion of n-type FinFET 106A and n-type FinFET 106B, are silicon fins. In some embodiments, substrate 112 is a semiconductor-on-insulator substrate, such as a silicon-on-insulator substrate, a silicon germanium-on-insulator substrate, or a germanium-on-insulator substrate.

Source/drain regions of fins 110A-110F are depicted in FIG. 2 as recessed portions of fins 110A-110F. P-type FinFETs 104A-104D have p-type epitaxial source/drains 120A that extend from recessed portions of fins 110A-110D, respectively, and n-type FinFET 106A and n-type FinFET 106B have n-type epitaxial source/drains 120B that extend from recessed portions of fin 110E and fin 110F, respectively. P-type epitaxial source/drains 120A include a semiconductor material doped with p-type dopants, such as boron, indium, other p-type dopant, or combinations thereof. N-type epitaxial source/drains 120B include a semiconductor material doped with n-type dopants, such as phosphorus, arsenic, other n-type dopant, or combinations thereof. In some embodiments, p-type epitaxial source/drains 120A and n-type epitaxial source/drains 120B include the same semiconductor material. In some embodiments, p-type epitaxial source/drains 120A and n-type epitaxial source/drains 120B include different semiconductor materials. For example, p-type epitaxial source/drains 120A include silicon and germanium doped with boron, other p-type dopant, or combinations thereof, an n-type epitaxial source/drains 120B include silicon and/or carbon doped with phosphorous, other n-type dopant, or combinations thereof. In some embodiments, p-type epitaxial source/drains 120A and/or n-type epitaxial source/drains 120B have multi-layer structures, such as described herein. Lightly doped source/drain (LDD) regions, heavily doped source/drain (HDD) regions, other doped regions, or combinations thereof may be disposed in p-type epitaxial source/drains 120A and/or n-type epitaxial source/drains 120B. Such doped regions may extend into fins 110A-110F. The present disclosure contemplates embodiments where source/drain regions of fins 110A-110F are not recessed, such that p-type epitaxial source/drains 120A are disposed over tops and sidewalls of fins 110A-110D and n-type epitaxial source/drains 120B are disposed over tops and sidewalls of fin 110E and fin 110F. In such embodiments, fins 110A-110F may be wrapped by respective p-type epitaxial source/drains 120A or n-type epitaxial source/drains 120B.

In the depicted embodiment, p-type epitaxial source/drains 120A and n-type epitaxial source/drains 120B each have lower portions and upper portions. Lower portions of p-type epitaxial source/drains 120A and lower portions of n-type epitaxial source/drains 120B extend laterally (e.g., along the x-direction) between respective fin spacers 125, extend vertically (e.g., along the z-direction) from respective fins 110A-110F to top surfaces of respective fin spacers 125, and have widths that are substantially equal to widths of respective fins 110A-110F. Upper portions of p-type epitaxial source/drains 120A and upper portions of n-type epitaxial source/drains 120B extend vertically (e.g., along the z-direction) from top surfaces of respective fin spacers 125 to heights above respective fin spacers 125 and laterally (e.g., along the x-direction) to distances beyond outer sidewalls of respective fin spacers 125 (i.e., sidewalls of fin spacers 125 that are opposite inner sidewalls of fin spacers 125). Upper portions of p-type epitaxial source/drains 120A have a width W1 that is greater than a width of fins 110A-110D, and upper portions of n-type epitaxial source/drains 120B have a width W2 that is greater than a width of fin 110E and fin 110F. Width W1 is a maximum (greatest) width of p-type epitaxial source/drains 120A along the x-direction, and width W2 is a maximum (greatest) width of n-type epitaxial source/drains 120B along the x-direction. In other words, width W1 and width W2 are between outermost sidewalls (also referred to as outermost side surfaces, outermost side points, and/or outermost facets) of p-type epitaxial source/drains 120A and n-type epitaxial source/drains 120B, respectively. In FIG. 2, width W1 is greater than width W2. In some embodiments, such width difference arises from p-type epitaxial source/drains 120A and n-type epitaxial source/drains 120B having different cross-sectional profiles and/or shapes. For example, in FIG. 2, upper portions of p-type epitaxial source/drains 120A are diamond-shaped, and upper portions of n-type epitaxial source/drains 120B are oval-shaped. In such embodiments, a distance that p-type epitaxial source/drains 120A extend laterally beyond fin spacers 125 is greater than a distance that n-type epitaxial source/drains 120B extend laterally beyond fin spacers 125. In some embodiments, width W1 is about 20 nm to about 40 nm. In some embodiments, width W2 is about 15 nm to about 35 nm. P-type epitaxial source/drains 120A and/or n-type epitaxial source/drains 120B having widths greater than about 40 nm and about 35 nm, respectively, may unintentionally merge with directly adjacent epitaxial source/drains of different FinFETs, leading to epi-to-epi shorting, electrical shorting, and/or device degradation. P-type epitaxial source/drains 120A and/or n-type epitaxial source/drains 120B having widths less than about 20 nm and about 15 nm, respectively, may not provide sufficient source/drain contact landing windows, thereby increasing difficulty of landing subsequently source/drain contacts on p-type epitaxial source/drains 120A and/or n-type epitaxial source/drains 120B and increasing sensitivity of the FinFETs to source/drain contact misalignment and/or overlay shifts. Further, p-type epitaxial source/drains 120A and/or n-type epitaxial source/drains 120B having widths less than about 20 nm and about 15 nm, respectively, may be too small to adequately offset and/or reduce short channel effects (in particular, those that can arise when a gate length of a transistor is less than about 10 nm), minimize parasitic capacitance, minimize parasitic resistance, or combinations thereof.

A spacing S4 is between epitaxial source/drains of p-type single-fin FinFETs, such as between p-type epitaxial source/drains 120A of p-type FinFET 104A and p-type FinFET 104B. A spacing S5 is between epitaxial source/drains of n-type single-fin FinFETs, such as between n-type epitaxial source/drains 120B of n-type FinFET 106A and n-type FinFET 106B. A spacing S6 is between epitaxial source/drains of n-type single-fin FinFETs and p-type single-fin FinFETs, such as between p-type epitaxial source/drains 120A of p-type FinFET 104C and n-type epitaxial source/drains 120B of n-type FinFET 106A and between n-type epitaxial source/drains 120B of n-type FinFET 106B and p-type epitaxial source/drains 120A of p-type FinFET 104D. Spacing S4, spacing S5, and spacing S6 are each along the x-direction, such as a widthwise direction of fins 110A-110F and a widthwise direction of p-type epitaxial source/drains 120A and n-type epitaxial source/drains 120B. Spacing S4, spacing S5, and spacing S6 are minimum distances between epitaxial source/drains of directly adjacent FinFETs. For example, spacing S4 is a smallest distance between directly adjacent p-type epitaxial source/drains 120A of different p-type FinFETs, spacing S5 is a smallest distance between directly adjacent n-type epitaxial source/drains 120B of different n-type FinFETs, and spacing S6 is a smallest distance between directly adjacent p-type epitaxial source/drains 120A and n-type epitaxial source/drains 120B of p-type FinFETs and n-type FinFETs, respectively. Spacing S4 is less than spacing S1, spacing S5 is less than spacing S2, and spacing S6 is less than spacing S3 to allow for lateral extension/expansion (and thus, epi volume expansion and/or enlargement of epi lateral dimensions, which increases source/drain contact landing areas) of p-type epitaxial source/drains 120A and n-type epitaxial source/drains 120B. Spacing S4 and spacing S5 are also less than width W1 and width W2, respectively. In some embodiments, spacing S4, spacing S5, and/or spacing S6 are also less than a width W3 of isolation fins 140, which are inserted between adjacent epitaxial source/drains of different FinFETs and are described further below. In some embodiments, width W3 is about 5 nm to about 10 nm.

In some embodiments, spacing S4 is about 15 nm to about 30 nm. In some embodiments, spacing S5 is about 10 nm to about 25 nm. In some embodiments, spacing S6 is about 10 nm to about 20 nm. Reducing spacing S4, spacing S5 and/or spacing S6 to less than about 10 nm can lead to unintentional merging of adjacent epitaxial source/drains of different FinFETs during epitaxial source/drain formation, thermal processes after epitaxial source/drain formation (e.g., during an annealing process for activating dopants in the epitaxial source/drains and/or during an annealing process implemented during source/drain contact formation, such as that used to form silicide features over the epitaxial source/drains), other subsequent process, or combinations thereof. In some embodiments, reducing spacing S4, spacing S5 and/or spacing S6 to less than about 10 nm can lead to unintentional merging of subsequently formed source/drain contacts to adjacent epitaxial source/drains of different FinFETs. Further, spacing S4, spacing S5, and/or spacing S6 that are too small (e.g., less than about 10 nm) may not provide adequate isolation between devices (i.e., width W3 correspondingly decreases). Where fin pitches and/or fin spacings (e.g., spacing S1, spacing S2, and spacing S3, respectively) are fixed to maintain a desired FinFET density and/or device density of multigate device 100, increasing spacing S4, spacing S5, and/or spacing S6 to greater than about 30 nm, 25 nm, and 20 nm, respectively, can lead to corresponding width and/or area decreases of epitaxial source/drains that reduce source/drain contact landing windows too much, making it difficult to land subsequently formed source/drain contacts on the epitaxial source/drains. Further, increasing spacing S4, spacing S5, and/or spacing S6 to greater than about 30 nm, 25 nm, and 20 nm, respectively, can lead to corresponding volume decreases of the epitaxial source/drains, such that the epitaxial source/drains are too small to adequately offset and/or reduce short channel effects (in particular, those that can arise when a gate length of a transistor is less than about 10 nm), minimize parasitic capacitance, minimize parasitic resistance, or combinations thereof. Even further, spacing S4, spacing S5, and/or spacing S6 that are too large (e.g., greater than about 30 nm, 25 nm, and 20 nm, respectively) undesirably reduces device density (i.e., less devices can be fabricated and/or located within a given area) and/or increases fabrication costs.

Multigate device 100 is configured with optimal spacing between epitaxial source/drains of single-fin FinFETs. For example, epitaxial source/drain spacing between same type single-fin FinFETs (1F N-N spacing and/or 1F P-P spacing) is greater than epitaxial source/drain spacing between different type single-fin FinFETs (1F N-P spacing and/or 1F P-N spacing), and epitaxial source/drain spacing between p-type single-fin FinFETs (1F P-P spacing) is greater than epitaxial source/drain spacing between n-type single-fin FinFETs (1F N-N spacing). Such spacing differences account for profile variations of different type epitaxial source/drains and additional isolation and/or additional unintentional merging reduction/prevention provided by isolation fins 140. For example, since an n-type epitaxial source/drain's width and lateral extension beyond fin sidewalls is less than a p-type epitaxial source/drain's width and lateral extension beyond fin sidewalls, adjacent N-N epitaxial source/drains and adjacent N-P epitaxial source/drains are each less susceptible to unintentional merging than adjacent P-P epitaxial source/drains. As another example, since n-type epitaxial source/drains and p-type epitaxial source/drains are often formed separately, such that n-type epitaxial source/drains are protected (e.g., covered by a masking layer, such as a resist layer) when forming p-type epitaxial source/drains and/or vice versa, adjacent N-P epitaxial source/drains are less susceptible to unintentional merging than adjacent P-P epitaxial source/drains and/or adjacent N-N epitaxial source/drains. Accordingly, 1F N-N spacing (spacing S5, which accommodates two n-type epitaxial source/drains having lesser widths and lesser lateral extensions than p-type epitaxial source/drains) and 1F N-P spacing (spacing S6, which accommodates lateral dimensions of one p-type epitaxial source/drain and one n-type epitaxial source/drain) can be configured less than 1F P-P spacing (spacing S4, which accommodates two p-type epitaxial source/drains having greater widths and greater lateral extensions than n-type epitaxial source/drains). In FIG. 2, spacing S5 is less than spacing S4 (i.e., 1F N-N spacing is less than 1F P-P spacing), and spacing S6 is less than spacing S4 (i.e., 1F N-P/P-N spacing is less than 1F P-P spacing). Spacing S5 is about 5% to about 30% less than spacing S4 and spacing S6 is about 20% to about 40% less than spacing S4 to minimize unintentional merging of adjacent epitaxial source/drains while maximizing epitaxial source/drain lateral dimensions and source/drain contact landing windows. Spacing S6 is also less than spacing S5 (i.e., 1F N-P/N-P spacing is less than 1F N-N spacing), such as about 20% to about 40% less than spacing S5 to minimize unintentional merging of adjacent epitaxial source/drains while maximizing epitaxial source/drain lateral dimensions and source/drain contact landing windows.

Channel regions of fins 110A-110F are non-recessed portions of fins 110A-110F depicted with dashed lines in FIG. 2. In some embodiments, p-type epitaxial source/drains 120A and/or n-type epitaxial source/drains 120B include materials and/or dopants that achieve desired tensile stress and/or compressive stress in channel regions of fins 110A-110F. Channel regions of fins 110A-110F are positioned and extend between respective p-type epitaxial source/drains 120A or respective n-type epitaxial source/drains 120B along the y-direction and, in FIG. 2, are depicted behind respective p-type epitaxial source/drains 120A or respective n-type epitaxial source/drains 120B. Gate stacks wrap channel regions of fins 110A-110F in the X-Z plane (for example, each of fins 110A-110F has a respective gate stack disposed over its top and its sidewalls) and over a top of channel regions of fins 110A-110F in the Y-Z plane. The gate stacks are configured to achieve desired functionality according to design requirements of multigate device 100, such that the gate stacks of p-type FinFETs 104A-104D, n-type FinFET 106A, and n-type FinFET 106B can include the same or different layers and/or materials.

Multigate device 100 further includes various dielectric structures, such as fin spacers 125, substrate isolation features 130, isolation fins 140, and a dielectric layer 150. For example, each depicted FinFET of multigate device 100 has fin spacers 125 disposed along sidewalls of its respective epitaxial source/drains (e.g., p-type epitaxial source/drains 120A or n-type epitaxial source/drains 120B). In the depicted embodiment, fin spacers 125 have inner sidewalls and outer sidewalls opposite the inner sidewalls, where the inner sidewalls physically contact p-type epitaxial source/drains 120A or n-type epitaxial source/drains 120B and the outer sidewalls physically contact dielectric layer 150. Fin spacers 125 further have bottom surfaces that physically contact substrate isolation features 130 and top surfaces that physically contact p-type epitaxial source/drains 120A or n-type epitaxial source/drains 120B, where the bottom surfaces and the top surfaces extend between the inner sidewalls and the outer sidewalls. Fin spacers 125 include silicon, oxygen, carbon, nitrogen, other suitable dielectric material constituent, or combinations thereof, such as silicon oxide, silicon nitride, silicon oxynitride, silicon carbide, silicon carbonitride, silicon oxycarbonitride, or combinations thereof. Fin spacers 125 may have a multi-layer structure. For example, fin spacers 125 can include a first dielectric layer that includes silicon nitride and/or silicon oxide and a second dielectric layer that includes silicon oxycarbonitride. In some embodiments, fin spacers 125 include more than one set of spacers, such as fin spacer liners (e.g., L-shaped spacer liners) and main fin spacers disposed over the fin spacer liners. In some embodiments, fin spacers 125 are omitted from multigate device 100.

Substrate isolation features 130, isolation fins 140, and dielectric layer 150 combine to electrically isolate active regions of p-type FinFETs, n-type FinFETs, or combinations thereof of multigate device 100, such as p-type FinFETs 104A-104D, n-type FinFET 106A, and n-type FinFET 106B. Substrate isolation features 130 are disposed in substrate 112 and electrically isolate fins 110A-110F from one another. Substrate isolation features 130 are disposed along source/drain regions of fins 110A-110F, cover sidewalls of source/drain regions of fins 110A-110F, and fill spacings between fins 110A-110F (e.g., spacing S1, spacing S2, and spacing S3). In FIG. 2, top surfaces of source/drain regions of fins 110A-110F are below top surfaces of substrate isolation features 130, and p-type epitaxial source/drains 120A and n-type epitaxial source/drains 120B extend below top surfaces of substrate isolation features 130. Accordingly, substrate isolation features 130 are also disposed along and cover portions of sidewalls of p-type epitaxial source/drains 120A and/or n-type epitaxial source/drains 120B. In some embodiments, top surfaces of source/drain regions of fins 110A-110F are above top surfaces of substrate isolation features 130, and p-type epitaxial source/drains 120A and/or n-type epitaxial source/drains 120B do not extend below top surfaces of substrate isolation features 130.

Substrate isolation features 130 include silicon, oxygen, nitrogen, carbon, other suitable isolation and/or dielectric constituent, or combinations thereof. For example, substrate isolation features 130 include silicon oxide, silicon nitride, silicon oxynitride, other suitable isolation material, or combinations thereof. Substrate isolation features 130 are configured as STI structures, deep trench isolation (DTI) structures, local oxidation of silicon (LOCOS) structures, other suitable isolation structures, or combinations thereof. In the depicted embodiment, substrate isolation features 130 are STI structures. Substrate isolation features 130 can have a multi-layer structure. In some embodiments, substrate isolation features 130 include an oxide layer disposed over a silicon nitride liner. In some embodiments, substrate isolation features 130 include a dielectric layer disposed over a doped liner, such as a boron silicate glass (BSG) liner and/or a phosphosilicate glass (PSG) liner. In some embodiments, substrate isolation features 130 include a bulk dielectric layer disposed over a dielectric liner.

Isolation fins 140 are positioned between and electrically isolate epitaxial source/drains of different FinFETs from one another, such as p-type epitaxial source/drains 120A of p-type FinFET 104A and p-type FinFET 104B, n-type epitaxial source/drains 120B of n-type FinFET 106A and p-type FinFET 106B, p-type epitaxial source/drains 120A of p-type FinFET 104C and n-type epitaxial source/drains 120B of n-type FinFET 106A, and p-type epitaxial source/drains 120A of p-type FinFET 104D and n-type epitaxial source/drains 120B of n-type FinFET 106B. Isolation fins 140 may further electrically isolate fins 110A-110F from one another. Isolation fins 140 are disposed in dielectric layer 150 and extend into substrate isolation features 130, such that isolation fins 140 extend below top surfaces of substrate isolation features 130. In FIG. 2, isolation fins 140 further extend below top surfaces of fins 110A-110F. Spacings between adjacent epitaxial source/drain are configured greater than widths of isolation fins 140 to reduce and/or prevent epitaxial source/drain residue from forming and/or remaining on isolation fins 140 after epitaxial source/drain formation, thereby reducing and/or eliminating device remain defects. For example, where isolation fins 140 have width W3 along the x-direction, spacing S4, spacing S5, and spacing S6 are greater than width W3. In such embodiments, dielectric layer 150 is between isolation fins 140 and p-type epitaxial source/drains 120A and between isolation fins 140 and n-type epitaxial source/drains 120B. In some embodiments, width W3 is about 5 nm to about 10 nm, where 5 nm is a minimum allowable spacing between active regions of directly adjacent devices (e.g., a minimum allowable spacing between epitaxial source/drains). In such embodiments, spacing S6 can be greater than about 5 nm, and spacing S4 and spacing S6 can be greater than about 10 nm.

Isolation fins 140 include silicon, oxygen, nitrogen, carbon, other suitable isolation and/or dielectric constituent, or combinations thereof. For example, isolation fins 140 include silicon oxide, silicon nitride, silicon oxynitride, silicon carbonitride, silicon oxycarbonitride, other suitable isolation material, or combinations thereof. The present disclosure contemplates various configurations of isolation fins. For example, isolation fins 140 can have a multi-layer structure, such as a bulk dielectric layer (e.g., an oxide layer) disposed over a dielectric liner (e.g., a silicon nitride liner). In some embodiments, isolation fins 140 include a lower dielectric portion and an upper dielectric portion, where the lower dielectric portion and the upper dielectric portion are configured differently. In some embodiments, the lower portion includes a dielectric layer (e.g., an oxide layer) disposed over a dielectric liner. In some embodiments, the upper portion includes a high-k dielectric layer.

Dielectric layer 150 is disposed over p-type epitaxial source/drains 120A, n-type epitaxial source/drains 120B, fin spacers 125, substrate isolation features 130, and isolation fins 140. Because spacing S4, spacing S5, and spacing S6 are less than width W3, dielectric layer 150 is between isolation fins 140 and p-type epitaxial source/drains 120A, isolation fins 140 and n-type epitaxial source/drains 120B, and isolation fins 140 and fin spacers 125. Dielectric layer 150 includes a dielectric material that is different than a dielectric material on outer surfaces of isolation fins 140, such that dielectric layer 150 can be selectively etched relative to isolation fins 140 during source/drain contact formation. Dielectric layer 150 may have a multi-layer structure, such as an interlayer dielectric (ILD) layer formed over a contact etch stop layer (CESL). The ILD layer includes a dielectric material including, for example, silicon oxide, carbon doped silicon oxide, silicon nitride, silicon oxynitride, TEOS-formed oxide, PSG, BSG, BPSG, FSG, Black Diamond® (Applied Materials of Santa Clara, California), xerogel, aerogel, amorphous fluorinated carbon, parylene, BCB-based dielectric material, SiLK (Dow Chemical, Midland, Michigan), polyimide, other suitable dielectric material, or combinations thereof. In some embodiments, the ILD layer includes a dielectric material having a dielectric constant that is less than a dielectric constant of silicon dioxide (e.g., k<3.9). In some embodiments, the ILD layer includes a dielectric material having a dielectric constant that is less than about 2.5 (i.e., an extreme low-k (ELK) dielectric material), such as $SiO_2$ (for example, porous silicon dioxide), silicon carbide (SiC), and/or carbon-doped oxide (for example, a SiCOH-based material (having, for example, Si—$CH_3$ bonds)), each of which is tuned/configured to exhibit a dielectric constant less than about 2.5. The ILD layer can include a multilayer structure having multiple dielectric materials. The CESL includes a material different than the ILD layer, such as a dielectric material that is different than the dielectric material of the ILD layer. For example, where the ILD layer includes a dielectric material that includes silicon and oxygen and having a dielectric constant that is less than about the dielectric constant of silicon dioxide, the CESL can include silicon and nitrogen, such as silicon nitride or silicon oxynitride.

Referring to FIG. 3, for clarity and simplicity, similar features of multigate device 100 in FIG. 2 and multigate device 200 in FIG. 3 are identified by the same reference numerals. Multigate device 200 is similar in many respects to multigate device 100. For example, multigate device 200 includes fins 210A-210F similar to fins 110A-110F, a substrate 212 similar to substrate 112, p-type epitaxial source/drains 220A similar to p-type epitaxial source/drains 120A, n-type epitaxial source/drains 220B similar to n-type epitaxial source/drains 120B, fin spacers 125, substrate isolation features 130, isolation fins 140, and dielectric layer 150. In FIG. 3, multigate device 200 includes a device region 202A and a device region 202B. Device region 202A includes a p-type FinFET 204A and a p-type FinFET 204B, and device region 202B includes an n-type FinFET 206A and an n-type FinFET 206B. P-type FinFET 204A and n-type FinFET 206A are single-fin FinFETs (i.e., each FinFET includes one fin, where a channel of the FinFET is formed in one fin), and p-type FinFET 204B and n-type FinFET 206B are two-fin FinFETs (i.e., each FinFET includes two fins, where channels of the FinFET are formed in two fins). For example, p-type FinFET 204A includes fin 210A extending from substrate 212, p-type FinFET 204B includes fin 210B and fin 210C extending from substrate 212, n-type FinFET 206A includes fin 210D extending from substrate 212, and n-type FinFET 206B includes fin 210E and fin 210F extending from substrate 212.

A spacing S7 is between fins of a p-type two-fin FinFET (e.g., fin 210B and fin 210C are separated by spacing S7), a spacing S8 is between fins of a p-type single-fin FinFET and fins of a p-type two-fin FinFET (e.g., fin 210A and fin 210B are separated by spacing S8), a spacing S9 is between fins of an n-type two-fin FinFET (e.g., fin 210E and fin 210F are separated by spacing S9), and a spacing S10 is between fins of an n-type single-fin FinFET and fins of an n-type two-fin FinFET (e.g., fin 210D and fin 210E are separated by spacing S10). In FIG. 3, spacing S7 is greater than spacing S8 and spacing S9 is greater than spacing S10 to optimize epitaxial source/drain merging. For example, such spacing enhances merging of directly adjacent epitaxial source/drains of two-fin FinFETs while precluding merging of epitaxial source/drains of single-fin FinFETs with directly adjacent epitaxial source/drains of other FinFETs. In some embodiments, spacing S7 is about 10 nm to about 20 nm. In some embodiments, spacing S8 is about 40 nm to about 60 nm. In some embodiments, spacing S9 is about 10 nm to about 20 nm. In some embodiments, spacing S10 is about 40 nm to about 60 nm. Epitaxial source/drains grown from fins having spacing S7 and/or spacing S9 greater than about 20 nm may not merge to provide merged epitaxial source/drains for two-fin FinFETs, while epitaxial source/drains grown from fins of single-fin FinFETs may undesirably merge with epitaxial source/drains of directly adjacent two-fin FinFETs when spacing S8 and/or spacing S10 are less than about 40 nm, respectively. In some embodiments, spacing S7 and spacing S9 are the same. In some embodiments, spacing S7 and spacing S9 are different. In some embodiments, spacing S8 and spacing S10 are the same. In some embodiments, spacing S8 and spacing S10 are different.

P-type FinFET 204A has p-type epitaxial source/drains 220A that extend from recessed portions of fin 210A, and n-type FinFET 206A has n-type epitaxial source/drains 220B that extend from recessed portions of fin 210D. P-type FinFET 204B has p-type epitaxial source/drains 220A that extend from recessed portions of fin 210B and fin 210C and merge together to form merged p-type epitaxial source/drains 220A-M, and n-type FinFET 206B has n-type epitaxial source/drains 220B that extend from recessed portions of fin 210E and fin 210F and merge together to form merged n-type epitaxial source/drains 220B-M. Upper portions of p-type epitaxial source/drains 220A of p-type FinFET 204A have width W1, and upper portions of n-type epitaxial source/drains 220B of n-type FinFET 206A have width W2. Upper portions of merged p-type epitaxial source/drains 220A-M of p-type FinFET 204B have a width W4, and upper portions of merged n-type epitaxial source/drains 220B-M of n-type FinFET 206B have a width W5. Width W4 is a maximum (greatest) width of merged p-type epitaxial source/drains 220A-M along the x-direction, and width W5 is a maximum (greatest) width of merged n-type epitaxial source/drains 220B-M along the x-direction. In other words, width W4 and width W5 are between outermost sidewalls of merged p-type epitaxial source/drains 220A-M and merged n-type epitaxial source/drains 220B-M, respectively. In FIG. 3, width W4 is greater than width W5. In some embodiments, such width difference arises from p-type epitaxial source/drains 220A and n-type epitaxial source/drains 220B having different cross-sectional profiles and/or shapes. For example, in FIG. 3, upper portions of p-type epitaxial source/drains 220A are diamond-shaped, and upper portions of n-type epitaxial source/drains 220B are oval-shaped. In some embodiments, width W4 is about 40 nm to about 80 nm. In some embodiments, width W5 is about 35 nm to about 65 nm. Width W4 and width W5 less than about 40 nm and 35 nm, respectively, may not provide sufficient source/drain contact landing area, and width W4 and width W5 greater than about 80 nm and 65 nm, respectively, may be too large for fin pitches and/or fin spacings of advanced technology nodes, resulting in unintentional merging and/or device defects (e.g., epi residue). In some embodiments, a ratio of width W4 to width W5 is about 1.1 to about 1.5. In some embodiments, a length of a merged region of merged p-type epitaxial source/drains 220A-M along the z-direction (d1) is greater than a length of a merged region of n-type epitaxial source/drains 220A-M along the z-direction (d2).

A spacing S11 is between p-type epitaxial source/drains 220A of p-type FinFET 204A and merged p-type epitaxial source/drains 220A-M of p-type FinFET 204B, and a spacing S12 is between n-type epitaxial source/drains 220B of n-type FinFET 206A and merged n-type epitaxial source/drains 220B-M of n-type FinFET 206B. Spacing S11 and spacing S12 are along the x-direction, such as a widthwise direction of fins 210A-210F. Spacing S11 is a minimum distance between epitaxial source/drains of directly adjacent p-type single-fin FinFETs and p-type two-fin FinFETs, and spacing S12 is a minimum distance between epitaxial source/drains of directly adjacent n-type single-fin FinFETs and n-type two-fin FinFETs. For example, spacing S11 is a smallest distance between p-type epitaxial source/drains 220A of p-type FinFET 204A and merged p-type epitaxial source/drains 220A-M of p-type FinFET 204B, and spacing S12 is a smallest distance between n-type epitaxial source/ drains 220B of n-type FinFET 206A and merged n-type epitaxial source/drains 220B-M of n-type FinFET 206B. In some embodiments, spacing S11 is about 15 nm to about 30 nm. In some embodiments, spacing S12 is about 20 nm to about 35 nm. Reducing spacing S11 and/or spacing S12 to less than about 15 nm can lead to unintentional merging of directly adjacent epitaxial source/drains of different FinFETs during epitaxial source/drain formation, thermal processes after epitaxial source/drain formation (e.g., during an annealing process for activating dopants in the epitaxial source/drains after deposition and/or during an annealing process implemented during source/drain contact formation, such as that used to form silicide features over the epitaxial source/drains), other subsequent processing, or combinations thereof. In some embodiments, reducing spacing S11 and/or spacing S12 to less than about 15 nm can lead to unintentional merging of subsequently formed source/drain contacts to directly adjacent epitaxial source/drains of different FinFETs. Where fin pitches and/or fin spacings (e.g., spacing S8 and spacing S10, respectively) are fixed to maintain a desired FinFET density and/or device density of multigate device 200, increasing spacing S11 and/or spacing S12 to greater than about 35 nm can lead to corresponding width and/or area decreases of epitaxial source/drains that reduce source/drain contact landing windows, making it difficult to land subsequently formed source/drain contacts on the epitaxial source/drains. Further, increasing spacing S11 and/or spacing S12 to greater than about 35 nm can lead to corresponding volume decreases of the epitaxial source/ drains, such that the epitaxial source/drains are too small to adequately offset and/or reduce short channel effects (in particular, those that can arise when a gate length of a transistor is less than about 10 nm), minimize parasitic capacitance, minimize parasitic resistance, or combinations thereof.

Multigate device 200 is configured with optimal spacing between epitaxial source/drains of single-fin FinFETs and two-fin FinFETs of the same types. For example, epitaxial source/drain spacing between p-type single-fin FinFETs and p-type two-fin FinFETs (1F to 2F P-P spacing) is less than epitaxial source/drain spacing between n-type single-fin FinFETs and n-type two-fin FinFETs (1F to 2F N-N spacing), epitaxial source/drain spacing between p-type single-fin FinFETs and p-type two-fin FinFETs is greater than epitaxial source/drain spacing between p-type single-fin FinFETs (1F P-P spacing), and epitaxial source/drain spacing between n-type single-fin FinFETs and n-type two-fin FinFETs is greater than epitaxial source/drain spacing between n-type single-fin FinFETs (1F N-N spacing). Such spacing differences account for profile variations of different type epitaxial source/drains and additional isolation and/or additional merging prevention provided by isolation fins 140. For example, in FIG. 3, spacing S11 and spacing S12 are greater than width W3 (i.e., a width of isolation fins 140), spacing S11 is less than spacing S12 (i.e., 1F to 2F P-P spacing is less than 1F to 2F N-N spacing), spacing S11 is greater than spacing S4 (i.e., 1F to 2F P-P spacing is greater than 1F P-P spacing), and spacing S12 is greater than spacing S5 (i.e., 1F to 2F N-N is greater than 1F N-N spacing). Spacing S12 is greater than spacing S11 because widths of n-type epitaxial source/drains (e.g., width W2 and width W5) are less than widths of p-type epitaxial source/drains (e.g., width W1 and width W4), and thus, spacings between adjacent N-N epitaxial source/drains are greater than spacings between adjacent P-P epitaxial source/drains. In some embodiments, a difference between spacing S12 and spacing S11 (i.e., spacing S12-spacing S11) is about 3 nm to about 10 nm. Spacing S11 and spacing S12 are also greater than width W1 and width W2, respectively. Further, to ensure merger of the epitaxial source/drains of two-fin FinFETs, epitaxial growth/deposition parameters for forming epitaxial source/drains of two-fin FinFETs may be configured differently than epitaxial growth/deposition parameters for forming epitaxial source/drains of single-fin FinFETs. For example, a longer deposition time may be used when forming epitaxial source/drains of two-fin FinFETs, compared to when forming epitaxial source/drains of single-fin FinFETs, to ensure epitaxial source/drains grown from the two fins merge with each other. Different epitaxial growth/deposition parameters to ensure merging can result in lateral growth of merged epitaxial source/drains beyond fin sidewalls of two-fin FinFETs that is greater than lateral growth of epitaxial source/drains beyond fin sidewalls of single-fin FinFETs. The present disclosure accounts for such lateral growth differences by configuring 1F to 2F P-P spacing greater than 1F P-P spacing and 1F to 2F N-N spacing greater than 1F N-N spacing, thereby impeding unintentional merging between epitaxial source/drains of adjacent single-fin FinFETs and two-fin FinFETs of the same types. In some embodiments, a difference between spacing S4 and spacing S11 (i.e., spacing S11-spacing S4) is about 2 nm to about 10 nm. In some embodiments, a difference between spacing S5 and spacing S12 (i.e., spacing S12-spacing S5) is about 5 nm to about 10 nm.

Referring to FIG. 4, for clarity and simplicity, similar features of multigate device 100 in FIG. 2, multigate device 200 in FIG. 3, and multigate device 300 in FIG. 4 are identified by the same reference numerals. Multigate device 300 is similar in many respects to multigate device 100 and/or multigate device 200. For example, multigate device 300 includes fins 310A-310D similar to fins 110A-110F and/or fins 210A-210F, a substrate 312 similar to substrate 112 and/or substrate 212, p-type epitaxial source/drains 320A similar to p-type epitaxial source/drains 120A and/or p-type epitaxial source/drains 220A, n-type epitaxial source/drains 320B similar to n-type epitaxial source/drains 120B and/or n-type epitaxial source/drains 220B, merged p-type epitaxial source/drains 320A-M similar to merged p-type epitaxial source/drains 220A-M, n-type epitaxial source/drains 320B-M similar to merged n-type epitaxial source/drains 220B-M, fin spacers 125, substrate isolation features 130, isolation fins 140, and dielectric layer 150. In FIG. 4, multigate device 300 includes a device region 302 having a p-type FinFET 304 and an n-type FinFET 306. P-type FinFET 304 and n-type FinFET 306B are each two-fin FinFETs (i.e., each FinFET includes two fins, where channels of the FinFET are formed in two fins). For example, p-type FinFET 304 includes fin 310A and fin 310B extending from substrate 312 and having spacing S7, and n-type FinFET 306 includes fin 310C and fin 310D extending from substrate 312 and having spacing S9. P-type FinFET 304 has p-type epitaxial source/drains 320A that extend from recessed portions of fin 310A and fin 310B and merge to form merged p-type epitaxial source/drain 320A-M having width W4, and n-type FinFET 306 has n-type epitaxial source/drains 320B that extend from recessed portions of fin 310C and fin 310D and merge to form merged n-type epitaxial source/drain 320B-M having width W5.

In FIG. 4, a spacing S14 is between merged p-type epitaxial source/drains 320A-M of p-type FinFET 304 and merged n-type epitaxial source/drains 320B-M of n-type FinFET 306. Spacing S14 is along the x-direction, such as a widthwise direction of fins 310A-310D and a widthwise direction of merged p-type epitaxial source/drains 320A-M and merged n-type epitaxial source/drains 320B-M. Spacing S14 is a minimum distance between directly adjacent merged epitaxial source/drains of different type two-fin FinFETs. For example, spacing S14 is a smallest distance between directly adjacent merged p-type epitaxial source/drains 320A-M and merged n-type epitaxial source/drains 320B-M. In some embodiments, spacing S14 is about 15 nm to about 25 nm. Reducing spacing S14 to less than about 15 nm can lead to unintentional merging of merged p-type epitaxial source/drains 320A-M and merged n-type epitaxial source/drains 320B-M during epitaxial source/drain formation, thermal processes after epitaxial source/drain formation (e.g., during an annealing process for activating dopants in the epitaxial source/drains after deposition and/or during an annealing process implemented during source/drain contact formation, such as that used to form silicide features over the epitaxial source/drains), other subsequent processing, or combinations thereof. Where fin pitches and/or fin spacings (e.g., spacing S13) are fixed to maintain a desired FinFET density and/or device density of multigate device 300, increasing spacing S14 to greater than about 25 nm can lead to corresponding width and/or area decreases of merged p-type epitaxial source/drains 320A-M and/or merged n-type epitaxial source/drains 320B-M that reduce a source/drain contact landing window, making it difficult to land subsequently formed source/drain contacts on merged p-type epitaxial source/drains 320A-M and/or merged n-type epitaxial source/drains 320B-M.

Multigate device 300 is configured with optimal spacing between epitaxial source/drains of different type two-fin FinFETs. For example, epitaxial source/drain spacing between different type two-fin FinFETs (2F N-P spacing) is less than epitaxial source/drain spacing between p-type single-fin FinFETs, greater than epitaxial source/drain spacing between n-type single-fin FinFETs, and greater than epitaxial source/drain spacing between different type single-fin FinFETs. In FIG. 4, spacing S14 is greater than width W3 (i.e., a width of isolation fins 140), less than spacing S4 (1F P-P spacing), greater than spacing S5 (1F N-N spacing), and greater than spacing S6 (1F N-P spacing). Such spacing differences account for profile variations of different type epitaxial source/drains and additional isolation and/or additional merging prevention provided by isolation fins 140. For example, since an n-type epitaxial source/drain's width and lateral extension beyond fin sidewalls is less than a p-type epitaxial source/drain's width and lateral extension beyond fin sidewalls, adjacent N-P epitaxial source/drains are less susceptible to unintentional merging than adjacent P-P epitaxial source/drains but more susceptible to unintentional merging than adjacent N-N epitaxial source/drains. Accordingly, 2F N-P spacing (spacing S14, which accommodates lateral dimensions of one p-type epitaxial source/drain and one n-type epitaxial source/drain) can be configured less than 1F P-P spacing (spacing S4, which accommodates two p-type epitaxial source/drains having greater widths and greater lateral extensions than n-type epitaxial source/drains) but greater than 1F N-N spacing (spacing S5, which accommodates two n-type epitaxial source/drains having lesser widths and lesser lateral extensions than p-type epitaxial source/drains). In some embodiments, a difference between spacing S4 and spacing S14 (i.e., spacing S4−spacing S14) is about 2 nm to about 6 nm. In some embodiments, a difference between spacing S14 and spacing S5 (i.e., spacing S14−spacing S5) is about 1 nm to about 5 nm. Further, to ensure merger of the epitaxial source/drains of two-fin FinFETs, epitaxial growth/deposition parameters for forming epitaxial source/drains of two-fin FinFETs may be configured differently than epitaxial growth/deposition parameters for forming epitaxial source/drains of single-fin FinFETs. For example, a longer deposition time may be used when forming epitaxial source/drains of two-fin FinFETs, compared to when forming epitaxial source/drains of single-fin FinFETs, to ensure epitaxial source/drains grown from the two fins merge with each other. Different epitaxial growth/deposition parameters to ensure merging can result in lateral growth of merged epitaxial source/drains beyond fin sidewalls of two-fin FinFETs that is greater than lateral growth of epitaxial source/drains beyond fin sidewalls of single-fin FinFETs. The present disclosure accounts for such lateral growth differences by configuring 2F N-P spacing greater than 1F N-P spacing, thereby impeding unintentional merging between adjacent merged epitaxial source/drains of different type two-fin FinFETs.

The present disclosure contemplates various embodiments where device regions and/or FinFETs of multigate device 100, multigate device 200, and/or multigate device 300 are fabricated on the same wafer or different wafers to provide different devices and/or structures. For example, the present disclosure contemplates various embodiments of multigate devices that include device region 102A, device region 102B, device region 202A, device region 202B, device region 302, or combinations thereof. In another example, the present disclosure contemplates various embodiments of multigate devices that includes p-type FinFET 104A, p-type FinFET 104B, p-type FinFET 104C, p-type FinFET 104D, n-type FinFET 106A, n-type FinFET 106B, p-type FinFET 204A, p-type FinFET 204B, n-type FinFET 206A, n-type FinFET 206B, p-type FinFET 304, n-type FinFET 306, or combinations thereof. In some embodiments, the various device regions are directly adjacent to one another. In some embodiments, the various device regions are positioned at different locations on a wafer, such that one or more other device regions and/or device structures are disposed therebetween.

FIGS. 5A-5F are fragmentary cross-sectional views of a p-type device region 402A of a multigate device, in portion or entirety, at various fabrication stages according to various aspects of the present disclosure. FIGS. 6A-6F are fragmentary cross-sectional views of an n-type device region 402B of a multigate device, in portion or entirety, at various fabrication stages according to various aspects of the present disclosure. P-type device region 402A is similar to device region 202A of multigate device 200, and n-type device region 402B is similar to device region 202B of multigate device 200. FIGS. 5A-5F and FIGS. 6A-6F are discussed concurrently herein for ease of description and understanding. FIGS. 5A-5F and FIGS. 6A-6F have been simplified for the sake of clarity to better understand the inventive concepts of the present disclosure. Additional features can be added in p-type device region 402A and/or n-type device region 402B of the depicted multigate devices, and some of the features described below can be replaced, modified, or eliminated in other embodiments of p-type device region 402A and/or n-type device region 402B of the depicted multigate devices.

Figure 5A:
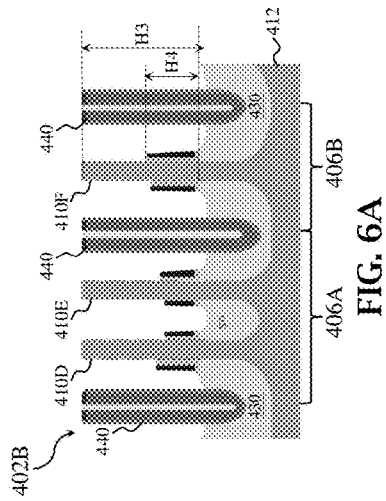
Figure 6A:
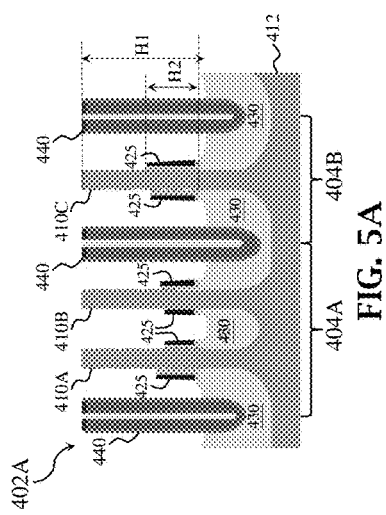

Turning to FIG. 5A and FIG. 6A, processing begins with receiving a multigate device after fin formation, isolation structure formation, and dummy gate formation. The multigate device includes p-type device region 402A, which includes a p-type FinFET 404A having two fins (e.g., a fin 410A and a fin 410B) and a p-type FinFET 404B having one fin (e.g., a fin 410C), and n-type device region 402B, which includes an n-type FinFET 406A having two fins (e.g., a fin 410D and a fin 410E) and an n-type FinFET 406B having one fin (e.g., a fin 410F). Fins 410A-410F are similar to fins 110A-110F, fins 210A-210F, and/or fins 310A-310D described herein. P-type device region 402A and n-type device region 402B each further include fin spacers 425 similar to fin spacers 125, substrate isolation features 430 similar to substrate isolation features 130, and isolation fins 440 similar to isolation fins 140. In some embodiments, substrate 412 is a silicon substrate, fins 410A-410C are silicon germanium fins, and fins 410D-410F are silicon fins. In FIG. 5A, fin 410A and fin 410B have spacing S8 therebetween, fin 410B and fin 410C have spacing S7 therebetween, fins 410A-410C have a height H1 along the z-direction, and fin spacers 425 have a height H2 along the z-direction. In FIG. 6A, fin 410D and fin 410E have spacing S9 therebetween, fin 410E and fin 410F have spacing S10 therebetween, fins 410D-410F have a height H3 along the z-direction, and fin spacers 425 have a height H4 along the z-direction. In some embodiments, height H1 is about 30 nm to about 80 nm. In some embodiments, height H2 is about 5 nm to about 20 nm. In some embodiments, height H3 is about 30 nm to about 80 nm. In some embodiments, height H4 is about 5 nm to about 20 nm. In some embodiments, height H1 and height H3 are the same. In some embodiments, height H1 and height H3 are different. In some embodiments, height H2 and height H4 are the same. In some embodiments, height H2 and height H4 are different. In some embodiments, heights of fin spacers 425 and/or widths of fin spacers 425 can be configured to control shapes and/or cross-sectional profiles of subsequently formed epitaxial source/drains.

Figure 5B:
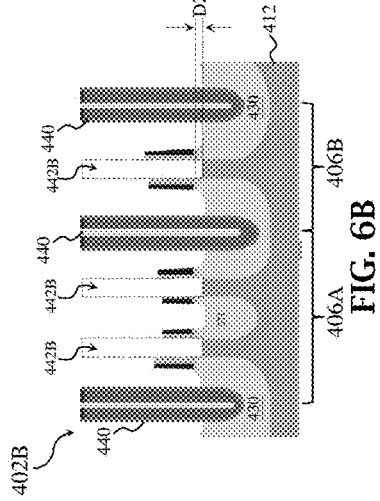
Figure 6B:
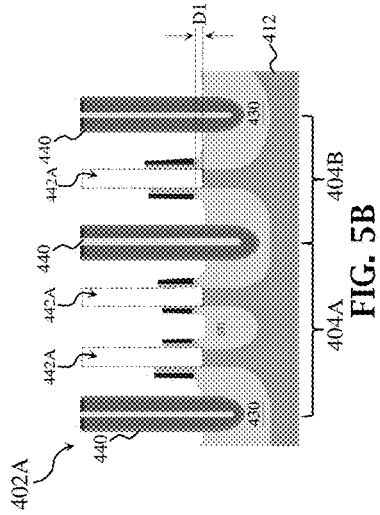

Turning to FIG. 5B and FIG. 6B, an etching process is performed to form source/drain recesses (trenches) 442A in source/drain regions of fins 410A-410C and source/drain recesses 442B in source/drain regions of fins 410D-410F.

Source/drain recesses 442A extend to a depth D1 below topmost surfaces of substrate isolation features 430 (e.g., such as those interfacing with bottoms of fin spacers 425), and source/drain recesses 442B extend to a depth D2 below topmost surfaces of substrate isolation features 430 (e.g., such as those interfacing with bottoms of fin spacers 425). In such embodiments, portions of fins 410A-410F between fin spacers 425 are removed by the etching process. In some embodiments, depth D1 is about 2 nm to about 10 nm. In some embodiments, depth D2 is about 2 nm to about 10 nm. In some embodiments, depth D1 and depth D2 are the same. In some embodiments, depth D1 and depth D2 are different. The etching process selectively removes fins 410A-410F with respect to isolation fins 440, substrate isolation features 430, and/or fin spacers 425. In other words, the etching process substantially removes fins 410A-410F but does not remove, or does not substantially remove isolation fins 440, substrate isolation features 430, and/or fin spacers 425. For example, an etchant is selected for the etch process that etches semiconductor materials (e.g., fins 410A-410F) at a higher rate than semiconductor materials (e.g., isolation fins 440, substrate isolation features 430, and/or fin spacers 425). In the depicted embodiment, the etching process removes portions of fin spacers 425, such that fin spacers 425 have varying heights and/or widths after forming source/drain recesses 442A and/or source/drain recesses 442B. In some embodiments, the etching process may recess top surfaces of substrate isolation features 430. The etching process is a dry etch, a wet etch, other suitable etching process, or combinations thereof. In the depicted embodiment, fins of single-fin FinFETs and fins of two-fin FinFETs are etched at the same time (i.e., fins 410A-410C are etched simultaneously and/or fins 410D-410F are etched simultaneously). In some embodiments, fins of single-fin FinFETs and fins of two-fin FinFETs are etched separately using different etching processes. In some embodiments, fins of p-type FinFETs and fins of n-type FinFETs are etched at the same time (i.e., fins 410A-410F are etched simultaneously). In some embodiments, fins of p-type FinFETs and fins of n-type FinFETs are etched separately using different etching processes. For example, a first etching process may be performed on fins 410A-410C to form source/drain recesses 442A and a second etching process may be performed on fins 410D-410F to form source/drain recesses 442B. In such embodiments, n-type device region 402B may be covered by a patterning layer (e.g., a hard mask layer and/or a resist layer) during the first etching process, and p-type device region 402A may be covered by a patterning layer during the second etching process.

Turning to FIGS. 5C-5E and FIGS. 6C-6E, processing proceeds with forming various epitaxial source/drains, such as merged p-type epitaxial source/drains 420A-M of p-type FinFET 404A, p-type epitaxial source/drains 420A of p-type FinFET 404B, merged n-type epitaxial source/drains 420B-M of n-type FinFET 406A, and n-type epitaxial source/drains 420B of n-type FinFET 406B. For example, processing includes epitaxially growing first semiconductor layers in the source/drain recesses, such as epitaxial layers 444A in source/drain recesses 442A and epitaxial layers 444B in source/drain recesses 442B (FIG. 5C and FIG. 6C); epitaxially growing second semiconductor layers over the first semiconductor layers in the source/drain recesses, such as epitaxial layers 446A in source/drain recesses 442A and epitaxial layers 446B in source/drain recesses 442B (FIG. 5D and FIG. 6D); and epitaxially growing third semiconductor layers over the second semiconductor layers in the source/drain recesses, such as epitaxial layers 448A in source/drain recesses 442A and epitaxial layers 448B in source/drain recesses 442B (FIG. 5E and FIG. 6E). The first semiconductor layers, such as epitaxial layers 444A and epitaxial layers 444B, have a first dopant concentration. The second semiconductor layers, such as epitaxial layers 446A and epitaxial layers 446B, have a second dopant concentration. The third semiconductor layers, such as epitaxial layers 448A and epitaxial layers 448B, have a third dopant concentration. The first dopant concentration, the second dopant concentration, and the third dopant concentration are different. For example, the second dopant concentration is greater than the first dopant concentration and the third dopant concentration, and the third dopant concentration is greater than the first dopant concentration.

Epitaxial layers 444A, epitaxial layers 444B, epitaxial layers 446A, epitaxial layers 446B, epitaxial layers 448A, epitaxial layers 448B, or combinations thereof can be formed by epitaxy processes that implement chemical vapor deposition (CVD) techniques (for example, vapor-phase epitaxy (VPE), ultra-high vacuum CVD (UHV-CVD), low pressure CVD (LPCVD), and/or plasma-enhanced CVD (PECVD)), molecular beam epitaxy, other suitable selective epitaxy growth (SEG) processes, or combinations thereof. In some embodiments, epitaxial layers 444A, epitaxial layers 444B, epitaxial layers 446A, epitaxial layers 446B, epitaxial layers 448A, epitaxial layers 448B, or combinations thereof are formed by a selective CVD process, such as remote plasma CVD (RPCVD), that introduces a silicon-containing precursor and/or a germanium-containing precursor and a carrier gas into a process chamber, where the silicon-containing precursor and/or the germanium-containing precursor interact with the composition of fins 410A-410F, epitaxial layers 446A, epitaxial layers 446B, epitaxial layers 448A, epitaxial layers 448B, or combinations thereof to form epitaxial source/drains. The silicon-containing precursor includes $SiH_4$, $Si_2H_6$, dichlorosilane (DCS), $SiHCl_3$, $SiCl_4$, other suitable silicon-containing precursors, or combinations thereof. The germanium-containing precursor includes $GeH_4$, $Ge_2H_6$, $GeCl_4$, $GeCl_2$, other suitable germanium-containing precursors, or combinations thereof. The carrier gas may be an inert gas, such as $H_2$ and/or $N_2$. In some embodiments, a dopant-containing precursor is introduced into the process chamber to facilitate in-situ doping of epitaxial layers 444A, epitaxial layers 444B, epitaxial layers 446A, epitaxial layers 446B, epitaxial layers 448A, epitaxial layers 448B, or combinations thereof. The dopant-containing precursor includes boron (e.g., $B_2H_6$), phosphorous (e.g., $PH_3$), arsenic (e.g., $AsH_3$), other suitable dopant-containing precursors, or combinations thereof. In some embodiments, epitaxial layers 444A, epitaxial layers 444B, epitaxial layers 446A, epitaxial layers 446B, epitaxial layers 448A, epitaxial layers 448B, or combinations thereof are doped by an ion implantation process after deposition. In some embodiments, an etchant-containing precursor is introduced into the process chamber to prevent or limit growth of silicon material and/or germanium material on dielectric surfaces and/or non-semiconductor surfaces. In such embodiments, CVD process parameters are tuned to ensure net deposition of semiconductor material on semiconductor surfaces. The etchant-containing precursor includes $Cl_2$, HCl, other etchant-containing precursors that can facilitate desired semiconductor material (e.g., silicon and/or germanium) growth selectivity, or combinations thereof. In some embodiments, annealing processes are performed to activate dopants in epitaxial layers 444A, epitaxial layers 444B, epitaxial layers 446A, epitaxial layers 446B, epitaxial layers 448A, epitaxial layers 448B, other source/drain regions (e.g., HDD regions and/or LDD regions), or combinations thereof.

P-type epitaxial source/drains (i.e., epitaxial layers 444A, epitaxial layers 446A, and epitaxial layers 448A) and n-type epitaxial source/drains (i.e., epitaxial layers 444B, epitaxial layers 446B, and epitaxial layers 448B) are formed in separate process chambers. In some embodiments, a silicon-containing precursor (e.g., DCS and/or $SiH_4$), a germanium-containing precursor (e.g., $GeH_4$), a carrier precursor (e.g., $H_2$), an etchant precursor (e.g., HCl), and a dopant precursor (e.g., $B_2H_6$) are introduced into a process chamber when depositing epitaxial layers 444A, epitaxial layers 446A, epitaxial layers 448A, or combinations thereof. In some embodiments, a silicon-containing precursor (e.g., DCS and/or $SiH_4$), a carrier precursor (e.g., $H_2$ and/or $N_2$), an etchant precursor (e.g., HCl), and a dopant precursor (e.g., $PH_3$ and/or $AsH_3$) are introduced into a process chamber when depositing epitaxial layers 444B, epitaxial layers 446B, epitaxial layers 448B, or combinations thereof. Epitaxial depositions parameters are controlled to achieve optimal lateral spacings and/or lateral dimensions for epitaxial source/drains, such as those described herein. For example, lateral growth of epitaxial material (in particular, during deposition of epitaxial layers 446A and epitaxial layers 446B) are controlled to provide p-type epitaxial source/drains 420A with width W1, merged p-type epitaxial source/drains 420A-M with width W4, n-type epitaxial source/drains 420B with width W2, merged n-type epitaxial source/drains 420B-M with width W5, spacing S11 between p-type epitaxial source/drains 420A and merged p-type epitaxial source/drains 420A-M, and spacing S12 between n-type epitaxial source/drains 420B and merged n-type epitaxial source/drains 420B-M. The epitaxial deposition parameters can includes deposition/growth time, deposition/growth temperature, precursor flow rate, precursor concentration, precursor type, other parameter, or combinations thereof.

Figure 5C:
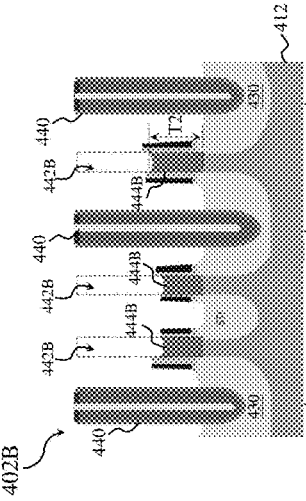
Figure 6C:
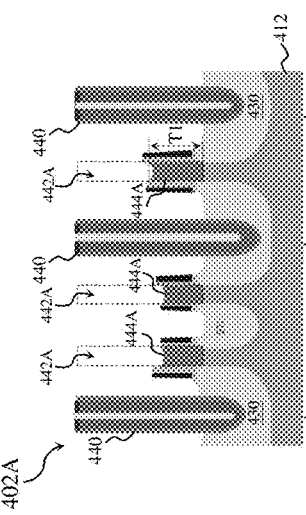

In FIG. 5C and FIG. 6C, epitaxial layers 444A and epitaxial layers 444B grow from fins 410A-410C and fins 410D-410F, respectively. Epitaxial layers 444A and epitaxial layers 444B can be referred to as shielding layers. In some embodiments, epitaxial layers 444A and epitaxial layers 444B are configured to prevent and/or reduce extrusion of dopants and/or other constituents of epitaxial layers 446A or epitaxial layers 446B, respectively, into channel regions of the multigate devices. In some embodiments, epitaxial layers 444A and epitaxial layers 444B are configured to reduce SCEs. Epitaxial layers 444A are disposed over fins 410A-410C and fill portions of source/drain recesses 442A between fin spacers 425, and epitaxial layers 444B are disposed over fins 410D-410F and fill portions of source/drain recesses 442B between fin spacers 425. Epitaxial layers 444A and epitaxial layers 444B do not extend above fin spacers 425. In the depicted embodiment, tops of epitaxial layers 444A and epitaxial layers 444B are at about a height of tops of fin spacers 425 and/or slightly recessed therefrom. Epitaxial layers 444A have a thickness T1, and epitaxial layers 444B have a thickness T2. In some embodiments, thickness T1 is about 5 nm to about 15 nm. In some embodiments, thickness T2 is about 5 nm to about 15 nm. In some embodiments, thickness T1 and thickness T2 are the same. In some embodiments, thickness T1 and thickness T2 are different.

Epitaxial layers 444A and epitaxial layers 444B include silicon, germanium, silicon germanium, other suitable semiconductor material, or combinations thereof. In the depicted embodiment, epitaxial layers 444A include p-doped silicon germanium and epitaxial layers 444B include n-doped silicon. The p-type dopant is boron, indium, other suitable p-type dopant, or combinations thereof, and the n-type dopant is phosphorous, arsenic, other suitable n-type dopant, or combinations thereof. In some embodiments, epitaxial layers 444A have a germanium concentration of about 25 at % to about 40 at %. In some embodiments, epitaxial layers 444A have a boron dopant concentration of about $1 \times 10^{20}$ $cm^{-3}$ to about $8 \times 10^{20}$ $cm^{-3}$. In some embodiments, epitaxial layers 444B have an arsenic dopant concentration or a phosphorous dopant concentration of about $1 \times 10^{20}$ $cm^3$ to about $1 \times 10^{21}$ $cm^{-3}$. Epitaxial layers 444A have any suitable germanium concentration profile and any suitable dopant profile, such as any suitable boron dopant profile, and epitaxial layers 444B have any suitable dopant profiles, such as any suitable arsenic dopant profile or phosphorous dopant profile. In some embodiments, epitaxial layers 444A have a substantially uniform (constant) germanium profile and/or substantially uniform boron dopant profile along thickness T1, such as a germanium concentration and/or a boron concentration that is substantially the same from bottoms to tops of epitaxial layers 444A. In some embodiments, epitaxial layers 444A have a gradient germanium profile and/or a gradient boron profile along thickness T1, such as a germanium concentration and/or a boron concentration that increases or decreases from bottoms to tops of epitaxial layers 444A (e.g., from about 25 at % to about 40 at % or vice versa and/or from about $1 \times 10^{20}$ $cm^{-3}$ to about $8 \times 10^{20}$ $cm^{-3}$ or vice versa, respectively). In some embodiments, epitaxial layers 444B have a substantially uniform n-type dopant profile. In some embodiments, epitaxial layers 444B have a gradient arsenic dopant profile and/or a gradient phosphorous dopant profile.

In FIG. 5D and FIG. 6D, epitaxial layers 446A and epitaxial layers 446B can grow from epitaxial layers 444A and epitaxial layers 444B, respectively. Lateral extension of epitaxial layers 446A and epitaxial layers 446B is controlled to optimize lateral dimensions and/or lateral spacings of n-type epitaxial source/drains in n-type device region 402B and p-type epitaxial source/drains in p-type device region 402A, such as described herein. For example, growth of epitaxial layers 446A and epitaxial layers 446B is controlled to minimize unintentional merging of epitaxial layers 446A and epitaxial layers 446B with epitaxial layers 446A and/or epitaxial layers 446B of different FinFETs while maximizing widths and/or volumes of epitaxial layers 446A and epitaxial layers 446B to maximize source/drain contact landing windows. In p-type FinFET 404A, epitaxial layers 446A merge to form merged p-type epitaxial layers 446A-M. In n-type FinFET 406A, epitaxial layers 446B merge to form merged n-type epitaxial layers 446B-M. Epitaxial layers 446A and epitaxial layers 446B have different shapes and/or cross-sectional profiles, which results in merged p-type epitaxial layers 446A-M and merged n-type epitaxial layers 446B-M having different shapes and/or cross-sectional profiles. For example, epitaxial layers 446A are diamond-shaped, and epitaxial layers 446B are oval-shaped, which results in different amounts of merging in p-type epitaxial source/drains and n-type epitaxial source/drains. In FIG. 5D, merged p-type epitaxial layers 446A-M have substantially planar tops, while in FIG. 6D, merged n-type epitaxial layers 446B-M have substantially wavy tops. In the depicted embodiment, a recess is formed in merged n-type epitaxial layers 446B-M by adjacently merged epitaxial layers 446B. In some embodiments, an etching process is performed after depositing epitaxial layers 446A and/or epitaxial layers 446B to modify shapes and/or cross-sectional profiles of epitaxial layers 446A and/or epitaxial layers 446B. Epitaxial layers 446A and epitaxial layers 446B have a thickness T3 and a thickness T4, respectively, along the z-direction. In some embodiments, thickness T3 is about 20 nm to about 60 nm. In some embodiments, thickness T4 is about 20 nm to about 60 nm. In some embodiments, thickness T3 and thickness T4 are the same. In some embodiments, thickness T3 and thickness T4 are different. Epitaxial layers 446A and epitaxial layers 446B include silicon, germanium, silicon germanium, other suitable semiconductor material, or combinations thereof. In the depicted embodiment, epitaxial layers 446A include p-doped silicon germanium and epitaxial layers 446B include n-doped silicon. The p-type dopant is boron, indium, other suitable p-type dopant, or combinations thereof, and the n-type dopant is phosphorous, arsenic, other suitable n-type dopant, or combinations thereof. A germanium concentration of epitaxial layers 446A is greater than a germanium concentration of epitaxial layers 444A, a p-type dopant concentration of epitaxial layers 446A is greater than a p-type dopant concentration of epitaxial layers 444A, and an n-type dopant concentration of epitaxial layers 446B is greater than an n-type dopant concentration of epitaxial layers 444B. In some embodiments, epitaxial layers 446A have a germanium concentration of about 40 at % to about 60 at %. In some embodiments, epitaxial layers 446A have a boron dopant concentration of about $8 \times 10^{20}$ cm$^{-3}$ to about $3 \times 10^{21}$ cm$^{-3}$. In some embodiments, epitaxial layers 446B have an arsenic dopant concentration or a phosphorous dopant concentration of about $8 \times 10^{20}$ cm$^{-3}$ to about $5 \times 10^{21}$ cm$^3$. In some embodiments, epitaxial layers 446A have a substantially uniform (constant) germanium profile and/or substantially uniform boron dopant profile along thickness T3, such as a germanium concentration and/or a boron concentration that is substantially the same from bottoms to tops of epitaxial layers 446A. In some embodiments, epitaxial layers 446A have a gradient germanium profile and/or a gradient boron profile along thickness T3, such as a germanium concentration and/or a boron concentration that increases or decreases from bottoms to tops of epitaxial layers 446A (e.g., from about 40 at % to about 60 at % or vice versa and/or from $8 \times 10^{20}$ cm$^3$ to about $3 \times 10^{21}$ cm$^{-3}$ or vice versa, respectively). In some embodiments, epitaxial layers 446B have a substantially uniform n-type dopant profile. In some embodiments, epitaxial layers 446B have a gradient arsenic dopant profile and/or a gradient phosphorous dopant profile. Epitaxial layers 446A and/or epitaxial layers 446B may have a multi-layer structure, such as first semiconductor layer that wraps a second semiconductor layer. In some embodiments, epitaxial layers 446A can include a first silicon germanium layer over a second silicon germanium layer, where a boron concentration in the first silicon germanium layer is greater than a boron concentration in the second silicon germanium layer. In some embodiments, epitaxial layers 446B can include a first silicon layer over a second silicon layer, where a phosphorous concentration in the first silicon layer is greater than a phosphorous concentration in the second silicon layer.

In FIG. 5E and FIG. 6E, epitaxial layers 448A and epitaxial layers 448B can grow from epitaxial layers 446A and epitaxial layers 446B, respectively. Epitaxial layers 448A and epitaxial layers 448B can be referred to as capping layers. In some embodiments, epitaxial layers 448A and epitaxial layers 448B function as capping layers that protect epitaxial layers 446A and epitaxial layers 446B, respectively, (i.e., heavily doped portions of the epitaxial source/drains) during subsequent processing, such as processing associated with fabricating source/drain contacts. Epitaxial layers 448A and epitaxial layers 448B have a thickness T5 and a thickness T6, respectively, along the z-direction. In some embodiments, thickness T5 is about 2 nm to about 10 nm. In some embodiments, thickness T6 is about 2 nm to about 10 nm. In some embodiments, thickness T5 and thickness T6 are the same. In some embodiments, thickness T5 and thickness T6 are different. Epitaxial layers 448A and epitaxial layers 448B include silicon, germanium, silicon germanium, other suitable semiconductor material, or combinations thereof. In the depicted embodiment, epitaxial layers 448A include p-doped silicon germanium and epitaxial layers 448B include n-doped silicon. The p-type dopant is boron, indium, other suitable p-type dopant, or combinations thereof, and the n-type dopant is phosphorous, arsenic, other suitable n-type dopant, or combinations thereof. A p-type dopant concentration of epitaxial layers 448A is less than a p-type dopant concentration of epitaxial layers 446A, and an n-type dopant concentration of epitaxial layers 448B is less than an n-type dopant concentration of epitaxial layers 446B. In some embodiments, epitaxial layers 448A have a germanium concentration of about 45 at % to about 50 at %. In some embodiments, epitaxial layers 448A have a boron dopant concentration of about $1 \times 10^{21}$ cm$^{-3}$ to about $2 \times 10^{21}$ cm$^{-3}$. In some embodiments, epitaxial layers 448B have an arsenic dopant concentration or a phosphorous dopant concentration of about $1 \times 10^{21}$ cm$^{-3}$ to about $3 \times 10^{21}$ cm$^{-3}$. Epitaxial layers 448A have any suitable germanium concentration profile and any suitable dopant profile, and epitaxial layers 448B have any suitable dopant profile.

Turning to FIG. 5F and FIG. 6F, source/drain contacts are formed to epitaxial source/drains. For example, a dielectric layer 450 similar to dielectric layer 150 is formed over p-type device region 402A and n-type device region 402B. Dielectric layer 450 fills spaces between isolation fins 440 and the epitaxial source/drains (e.g., merged p-type epitaxial source/drains 420A-M, p-type epitaxial source/drains 420A, merged n-type epitaxial source/drains 420B-M, and n-type epitaxial source/drains 420B), spaces between isolation fins 440 and fin spacers 425, and spaces between fin spacers 425. Device-level contacts can then be formed in dielectric layer 450, such as metal-to-poly (MP) contacts, which generally refer to contacts to a gate structure, and metal-to-device (MD) contacts, which generally refer to contacts to an electrically active region of a multigate device (e.g., epitaxial source/drains). Device-level contacts electrically and physically connect IC device features to local contacts (interconnects). In FIG. 5F, a source/drain contact 460A extends through dielectric layer 450 to physically contact p-type epitaxial source/drains of different FinFETs (i.e., merged p-type epitaxial source/drains 420A-M of p-type FinFET 404A and p-type epitaxial source/drains 420A of p-type FinFET 404B). In FIG. 6F, a source/drain contact 460B extends through dielectric layer 450 to physically contact n-type epitaxial source/drains of different FinFETs (i.e., merged n-type epitaxial source/drains 420B-M of n-type FinFET 406A and n-type epitaxial source/drains 420B of n-type FinFET 406B), respectively. In some embodiments, epitaxial layers 448A and epitaxial layers 448B are consumed (e.g., during silicide formation) and/or removed (e.g., during etching of dielectric layer 450 to form source/drain contact openings) during source/drain contact formation, such that source/drain contact 460A and source/drain contact 460B may physically contact epitaxial layers 446A and epitaxial layers 446B, respectively.

Source/drain contact 460A and source/drain contact 460B can be formed by performing a lithography and etching process (such as described herein) to form a first contact opening that extends through dielectric layer 450 to expose p-type epitaxial source/drains in p-type device region 402A and a second contact opening that extends through dielectric layer 450 to expose n-type epitaxial source/drains in n-type device region 402B; performing a first deposition process to form a contact barrier material over dielectric layer 450 that partially fills the first contact opening and the second contact opening; and performing a second deposition process to form a contact bulk material over the contact barrier material, where the contact bulk material fills a remainder of the first contact opening and the second contact opening. In such embodiments, the contact barrier material and the contact bulk material are disposed in the first contact opening and the second contact opening and over a top surface of dielectric layer 450. The first deposition process and the second deposition process can include CVD, PVD, ALD, HDPCVD, MOCVD, RPCVD, PECVD, LPCVD, ALCVD, APCVD, PEALD, electroplating, electroless plating, other suitable deposition methods, or combinations thereof. In some embodiments, silicide layers, such as a silicide layer 460A-1 and a silicide layer 460B-1, are formed over epitaxial source/drains before forming the contact barrier material (e.g., by depositing a metal layer over the epitaxial source/drain drains and heating the multigate device to cause constituents of the epitaxial source/drains to react with metal constituents of the metal layer). In some embodiments, the silicide layer includes a metal constituent (e.g., nickel, platinum, palladium, vanadium, titanium, cobalt, tantalum, ytterbium, zirconium, other suitable metal, or combinations thereof) and a constituent of the epitaxial source/drains (e.g., silicon and/or germanium). In the depicted embodiment, silicide layer 460A-1 and silicide layer 460B-1 include titanium and silicon. A CMP process and/or other planarization process is performed to remove excess contact bulk material and contact barrier material, for example, from over the top surface of dielectric layer 450, resulting in source/drain contact 460A and source/drain contact 460B (in other words, the contact barrier layer and the contact bulk layer filling the contact openings). The CMP process planarizes a top surface of source/drain contact 460A, a top surface of source/drain contact 460B, and a top surface of dielectric layer 450.

The contact barrier layer includes a material that promotes adhesion between a surrounding dielectric material (e.g., dielectric layer 450) and the contact bulk layer. The material of the contact barrier layer may further prevent diffusion of metal constituents from source/drain contact 460A and/or source/drain contact 460B-155 into the surrounding dielectric material. In some embodiments, the contact barrier layer includes titanium, titanium alloy, tantalum, tantalum alloy, cobalt, cobalt alloy, ruthenium, ruthenium alloy, molybdenum, molybdenum alloy, palladium, palladium alloy, other suitable constituent configured to promote and/or enhance adhesion between a metal material and a dielectric material and/or prevent diffusion of metal constituents from the metal material to the dielectric material, or combinations thereof. For example, the contact barrier layer includes tantalum, tantalum nitride, tantalum aluminum nitride, tantalum silicon nitride, tantalum carbide, titanium, titanium nitride, titanium silicon nitride, titanium aluminum nitride, titanium carbide, tungsten, tungsten nitride, tungsten carbide, molybdenum nitride, cobalt, cobalt nitride, ruthenium, palladium, or combinations thereof. In some embodiments, the contact barrier layer includes multiple layers. For example, the contact barrier layer may include a first sub-layer that includes titanium or tantalum and a second sub-layer that includes titanium nitride or tantalum nitride. The contact bulk layer includes tungsten, ruthenium, cobalt, copper, aluminum, iridium, palladium, platinum, nickel, low resistivity metal constituent, alloys thereof, or combinations thereof. In the depicted embodiment, source/drain contact 460A and/or source/drain contact 460B include tungsten and/or silicon. In some embodiments, source/drain contact 460A and/or source/drain contact 460B do not include a contact barrier layer (i.e., barrier-free) or source/drain contact 460A and/or source/drain contact 460B are partially barrier-free, where the contact barrier layer is disposed between a portion of the contact bulk layer and the dielectric layer. In some embodiments, the contact bulk layer includes multiple layers Before forming source/drain contact 460A and source/drain contact 460B, a gate replacement process may be to replace dummy gate stacks with gate stacks. In embodiments where multigate devices are GAA transistors and fins 410A-410F are semiconductor layer stacks configured for forming GAA transistors, a channel release process is performed after removing the dummy gate stacks and before forming the gate stacks to form suspended channel layers in channel regions of the multigate devices. The gate stacks include a gate dielectric (for example, a gate dielectric layer) and a gate electrode (for example, a work function layer and a bulk (or fill) conductive layer). The gate stacks may include numerous other layers, for example, capping layers, interface layers, diffusion layers, barrier layers, hard mask layers, or combinations thereof. In some embodiments, the gate dielectric layer is disposed over an interfacial layer (including a dielectric material, such as silicon oxide), and the gate electrode is disposed over the gate dielectric layer. The gate dielectric layer includes a dielectric material, such as silicon oxide, high-k dielectric material, other suitable dielectric material, or combinations thereof. Examples of high-k dielectric material include hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. High-k dielectric material generally refers to dielectric materials having a high dielectric constant (k value) relative to a dielectric constant of silicon dioxide (k≈3.9). For example, high-k dielectric material has a dielectric constant greater than about 3.9. In some embodiments, the gate dielectric layer is a high-k dielectric layer. In such embodiments, the gate stacks may be referred to as high-k/metal gates. The gate electrode includes a conductive material, such as polysilicon, Al, Cu, Ti, Ta, W, Mo, Ru, Co, Ag, Mn, Zr, TaN, NiSi, CoSi, TiN, TaN, WN, TiAl, TaAl, $TaA_1C$, TiAlN, TaCN, TaC, TaSiN, $MoSi_2$, $TaSi_2$, $NiSi_2$, other conductive material, or combinations thereof.

Epitaxial source/drain structures for enhancing performance of multigate devices, such as fin-like field-effect transistors (FETs) or gate-all-around (GAA) FETs, and methods of fabricating the epitaxial source/drain structures, are disclosed herein. In some embodiments, epitaxial source/drains disclosed herein have lateral dimensions and lateral spacings that maximize source/drain contact landing windows while minimizing and/or preventing unintentional merging between epitaxial source/drains of adjacent multigate devices. In some embodiments, epitaxial source/drains disclosed herein have lateral dimensions and lateral spacings that minimize epitaxial material residue (i.e., device remain defects). The lateral dimensions and/or lateral spacings disclosed herein account for epitaxial source/drain profile variations of different type multigate devices and additional isolation and/or additional merging prevention provided by isolation fins disposed between epitaxial source/drains. The present disclosure provides for many different embodiments.

An exemplary semiconductor structure includes a first multigate device and a second multigate device. The first multigate device has a first channel layer that extends between first epitaxial source/drains along a first direction. The first epitaxial source/drains have a first width along a second direction that is different than the first direction. The second multigate device has a second channel layer that extends between second epitaxial source/drains along the first direction. The second epitaxial source/drains have a second width along the second direction. The semiconductor structure further includes an isolation structure having a dielectric fin over a substrate isolation feature. The dielectric fin is between the first epitaxial source/drains and the second epitaxial source/drains. The dielectric fin has a third width along the second direction. A distance between the first epitaxial source/drains and the second epitaxial source/drains along the second direction is greater than the third width, less than the second width, and less than the first width. In some embodiments, the second width is different than the first width. In some embodiments, the first epitaxial source/drains have a first cross-sectional profile and the second epitaxial source/drains have a second cross-sectional profile.

In some embodiments, the first multigate device is a first single-fin p-type FinFET, the second multigate device is a second single-fin p-type FinFET, and the distance is about 15 nm to about 30 nm. In some embodiments, the first multigate device is a first single-fin n-type FinFET, the second multigate device is a second single-fin n-type FinFET, and the distance is about 10 nm to about 25 nm. In some embodiments, the first multigate device is a single-fin p-type FinFET, the second multigate device is a two-fin p-type FinFET, and the distance is about 15 nm to about 30 nm. In some embodiments, the first multigate device is a single-fin n-type FinFET, the second multigate device is a two-fin n-type FinFET, and the distance is about 20 nm to about 35 nm. In some embodiments, the first multigate device is a two-fin p-type FinFET, the second multigate device is a two-fin n-type FinFET, and the distance is about 15 nm to about 25 nm. In some embodiments, the first multigate device is a single-fin p-type FinFET, the second multigate device is a single-fin n-type FinFET, and the distance is about 5 nm to about 20 nm.

Another exemplary semiconductor structure includes a first multigate device having a first channel layer that extends between first epitaxial source/drains along a first direction, a second multigate device having a second channel layer that extends between second epitaxial source/drains along the first direction, a third multigate device having a third channel layer that extends between third epitaxial source/drains along the first direction, and a fourth multigate device having a fourth channel layer that extends between fourth epitaxial source/drains along the first direction. The semiconductor structure further includes a first isolation fin and a second isolation fin. The first isolation fin is between the first epitaxial source/drains and the second epitaxial source/drains. The second isolation fin is between the third epitaxial source/drains and the fourth epitaxial source/drains, the first isolation fin has a first width along a second direction that is different than the first direction, and the second isolation fin has a second width along the second direction. The first multigate device is adjacent the second multigate device and the third multigate device is adjacent the fourth multigate device. A first distance is between the first epitaxial source/drains and the second epitaxial source/drains along the second direction. A second distance is between the third epitaxial source/drains and the fourth epitaxial source/drains along the second direction. The first distance is different than the second distance, the first distance is greater than the first width, and the second distance is greater than the second width.

In some embodiments, the first multigate device and the second multigate device are single-fin n-type FinFETs, the third multigate device and the fourth multigate device are single-fin p-type FinFETs, and the first distance is less than the second distance. In some embodiments, the first distance is about 5% to about 30% less than the second distance. In some embodiments, the first epitaxial source/drains and the second epitaxial source/drains have a first cross-sectional profile and the third epitaxial source/drains and the fourth epitaxial source/drains have a second cross-sectional profile. In some embodiments, the first multigate device is a single-fin n-type FinFET, the second multigate device is a two-fin n-type FinFET, the third multigate device is a single-fin p-type FinFET, the fourth multigate device is a two-fin p-type FinFET, and the first distance is greater than the second distance. In some embodiments, a difference between the first distance and the second distance is about 3 nm to about 10 nm. In some embodiments, the first multigate device, the third multigate device, and the fourth multigate device are single-fin FinFETs and the second multigate device is a two-fin FinFET, the single-FinFETs and the two-fin FinFET are a same type, and the first distance is greater than the second distance. In some embodiments, the same type is p-type and a difference between the first distance and the second distance is about 2 nm to about 10 nm. In some embodiments, the same type is n-type and a difference between the first distance and the second distance is about 5 nm to about 10 nm.

An exemplary method includes forming a first fin, a second fin, a third fin, and a fourth fin extending from a substrate. The first fin, the second fin, the third fin, and the fourth fin each extend lengthwise along a first direction. A first space is between the first fin and the second fin along a second direction that is different than the first direction. A second space is between the third fin and the fourth fin along the second direction. The method further includes forming a first isolation fin and a second isolation fin over the substrate. The first isolation fin is in the first space between the first fin and the second fin, the second isolation fin is in the second space between the third fin and the fourth fin, the first isolation fin has a first width along the second direction, and the second isolation fin has a second width along the second direction. The method further includes forming first epitaxial source/drains over the first fin, second epitaxial source/drains over the second fin, third epitaxial source/drains over the third fin, and fourth epitaxial source/drains over the fourth fin. Forming the first epitaxial source/drains, the second epitaxial source/drains, the third epitaxial source/drains, and the fourth epitaxial source/drains is tuned to provide a first distance between the first epitaxial source/drains and the second epitaxial source/drains along the second direction and a second distance between the third epitaxial source/drains and the fourth epitaxial source/drains along the second direction. The first distance is different than the second distance. The first distance is greater than the first width. The second distance is greater than the second width. The first epitaxial source/drains and the second epitaxial source/drains may have a first cross-sectional profile and the third epitaxial source/drains and the fourth epitaxial source/drains may have a second cross-sectional profile.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
    a first multigate device having a first channel layer that extends between first epitaxial source/drains along a first direction, wherein the first epitaxial source/drains have a first width along a second direction that is different than the first direction;
    a second multigate device having a second channel layer that extends between second epitaxial source/drains along the first direction, wherein the second epitaxial source/drains have a second width along the second direction;
    an isolation structure having a dielectric fin over a substrate isolation feature, wherein the dielectric fin is between the first epitaxial source/drains and the second epitaxial source/drains and the dielectric fin has a third width along the second direction;
    wherein a distance between the first epitaxial source/drains and the second epitaxial source/drains along the second direction is greater than the third width, less than the second width, and less than the first width; and
    wherein the first multigate device is a single-fin p-type FinFET, the second multigate device is a two-fin p-type FinFET, and the distance is about 15 nm to about 30 nm.

2. The semiconductor structure of claim 1, further comprising a source/drain contact disposed on one of the first epitaxial source/drains and one of the second epitaxial source/drains, wherein the source/drain contact extends over the dielectric fin.

3. The semiconductor structure of claim 1, wherein the second width is different than the first width.

4. The semiconductor structure of claim 1, wherein the first epitaxial source/drains have a first cross-sectional profile and the second epitaxial source/drains have a second cross-sectional profile.

5. The semiconductor structure of claim 1, further comprising an interlayer dielectric (ILD) layer disposed between the dielectric fin and the first epitaxial source/drains and disposed between the dielectric fin and the second epitaxial source/drains.

6. A semiconductor structure comprising:
    a first multigate device having a first channel layer that extends between first epitaxial source/drains along a first direction, wherein the first epitaxial source/drains have a first width along a second direction that is different than the first direction;
    a second multigate device having a second channel layer that extends between second epitaxial source/drains along the first direction, wherein the second epitaxial source/drains have a second width along the second direction;
    an isolation structure having a dielectric fin over a substrate isolation feature, wherein the dielectric fin is between the first epitaxial source/drains and the second epitaxial source/drains and the dielectric fin has a third width along the second direction;
    wherein a distance between the first epitaxial source/drains and the second epitaxial source/drains along the second direction is greater than the third width, less than the second width, and less than the first width; and
    wherein the first multigate device is a single-fin n-type FinFET, the second multigate device is a two-fin n-type FinFET, and the distance is about 20 nm to about 35 nm.

7. The semiconductor structure of claim 6, wherein the second width is different than the first width.

8. The semiconductor structure of claim 6, wherein the first epitaxial source/drains have a first cross-sectional profile and the second epitaxial source/drains have a second cross-sectional profile.

9. The semiconductor structure of claim 6, further comprising a source/drain contact disposed on one of the first epitaxial source/drains and one of the second epitaxial source/drains, wherein the source/drain contact extends over the dielectric fin.

10. A semiconductor structure comprising:
    a first multigate device having a first channel layer that extends between first epitaxial source/drains along a first direction;
    a second multigate device having a second channel layer that extends between second epitaxial source/drains along the first direction;
    a third multigate device having a third channel layer that extends between third epitaxial source/drains along the first direction;
    a fourth multigate device having a fourth channel layer that extends between fourth epitaxial source/drains along the first direction;
    a first isolation fin and a second isolation fin, wherein the first isolation fin is between the first epitaxial source/drains and the second epitaxial source/drains, the second isolation fin is between the third epitaxial source/drains and the fourth epitaxial source/drains, the first isolation fin has a first width along a second direction that is different than the first direction, and the second isolation fin has a second width along the second direction; and
    wherein:
        the first multigate device is adjacent the second multigate device and the third multigate device is adjacent the fourth multigate device,
        a first distance is between the first epitaxial source/drains and the second epitaxial source/drains along the second direction,
        a second distance is between the third epitaxial source/drains and the fourth epitaxial source/drains along the second direction, and
        the first distance is different than the second distance, the first distance is greater than the first width, and the second distance is greater than the second width.

11. The semiconductor structure of claim 10, wherein the first multigate device and the second multigate device are single-fin n-type FinFETs, the third multigate device and the fourth multigate device are single-fin p-type FinFETs, and the first distance is less than the second distance.

12. The semiconductor structure of claim 11, wherein the first distance is about 5% to about 30% less than the second distance.

13. The semiconductor structure of claim 10, wherein the first epitaxial source/drains and the second epitaxial source/drains have a first cross-sectional profile and the third epitaxial source/drains and the fourth epitaxial source/drains have a second cross-sectional profile.

14. The semiconductor structure of claim 10, wherein the first multigate device is a single-fin n-type FinFET, the second multigate device is a two-fin n-type FinFET, the third multigate device is a single-fin p-type FinFET, the fourth multigate device is a two-fin p-type FinFET, and the first distance is greater than the second distance.

15. The semiconductor structure of claim 14, wherein a difference between the first distance and the second distance is about 3 nm to about 10 nm.

16. The semiconductor structure of claim 10, wherein:
the first multigate device, the third multigate device, and the fourth multigate device are single-fin FinFETs and the second multigate device is a two-fin FinFET;
the single-FinFETs and the two-fin FinFET are a same type; and
the first distance is greater than the second distance.

17. The semiconductor structure of claim 16, wherein the same type is p-type and a difference between the first distance and the second distance is about 2 nm to about 10 nm.

18. The semiconductor structure of claim 16, wherein the same type is n-type and a difference between the first distance and the second distance is about 5 nm to about 10 nm.

19. A method comprising:
forming a first fin, a second fin, a third fin, and a fourth fin extending from a substrate, wherein the first fin, the second fin, the third fin, and the fourth fin each extend lengthwise along a first direction, a first space is between the first fin and the second fin along a second direction that is different than the first direction, and a second space is between the third fin and the fourth fin along the second direction;
forming a first isolation fin and a second isolation fin over the substrate, wherein the first isolation fin is in the first space between the first fin and the second fin, the second isolation fin is in the second space between the third fin and the fourth fin, the first isolation fin has a first width along the second direction, and the second isolation fin has a second width along the second direction;
forming first epitaxial source/drains over the first fin, second epitaxial source/drains over the second fin, third epitaxial source/drains over the third fin, and fourth epitaxial source/drains over the fourth fin; and
wherein the forming the first epitaxial source/drains, the second epitaxial source/drains, the third epitaxial source/drains, and the fourth epitaxial source/drains is tuned to provide:
a first distance between the first epitaxial source/drains and the second epitaxial source/drains along the second direction,
a second distance between the third epitaxial source/drains and the fourth epitaxial source/drains along the second direction, and
wherein the first distance is different than the second distance, the first distance is greater than the first width, and the second distance is greater than the second width.

20. The method of claim 19, wherein the first epitaxial source/drains and the second epitaxial source/drains have a first cross-sectional profile and the third epitaxial source/drains and the fourth epitaxial source/drains have a second cross-sectional profile.

* * * * *